(12) United States Patent
Muroi et al.

(10) Patent No.: US 7,879,527 B2
(45) Date of Patent: Feb. 1, 2011

(54) METHOD OF PRODUCING POSITIVE RESIST COMPOSITION, POSITIVE RESIST COMPOSITION, AND METHOD OF FORMING RESIST PATTERN

(75) Inventors: Masaaki Muroi, Kawasaki (JP); Kota Atsuchi, Kawasaki (JP); Takahiro Nakamura, Kawasaki (JP); Masakazu Yamada, Kawasaki (JP); Kensuke Saisyo, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 351 days.

(21) Appl. No.: 11/996,052

(22) PCT Filed: May 18, 2006

(86) PCT No.: PCT/JP2006/309924
§ 371 (c)(1),
(2), (4) Date: Jan. 17, 2008

(87) PCT Pub. No.: WO2007/010667
PCT Pub. Date: Jan. 25, 2007

(65) Prior Publication Data
US 2009/0092924 A1    Apr. 9, 2009

(30) Foreign Application Priority Data
Jul. 22, 2005    (JP) .............................. 2005-212903

(51) Int. Cl.
G03F 7/004    (2006.01)
G03F 7/30    (2006.01)

(52) U.S. Cl. .................... 430/270.1; 430/326; 430/910; 526/213; 526/234

(58) Field of Classification Search .............. 430/270.1, 430/326, 910; 526/213, 234
See application file for complete search history.

(56) References Cited

U.S. PATENT DOCUMENTS

| 6,479,211 | B1 | 11/2002 | Sato et al. |
| 6,982,140 | B2 | 1/2006 | Hada et al. |
| 7,695,889 | B2 * | 4/2010 | Yamagishi et al. ....... 430/270.1 |
| 2002/0012869 | A1 | 1/2002 | Adams et al. |
| 2003/0157423 | A1 | 8/2003 | Nagai et al. |
| 2005/0058938 | A1 | 3/2005 | Tachibana et al. |
| 2009/0233220 | A1 | 9/2009 | Muroi et al. |

FOREIGN PATENT DOCUMENTS

| EP | 1 574 901 A1 | 9/2005 |
| JP | 2000-338674 | 12/2000 |
| JP | 2001-125269 | 5/2001 |
| JP | 2002-020639 | 1/2002 |
| JP | 2002-099076 | 4/2002 |
| JP | 2002-348328 | 12/2002 |
| JP | 2003-167347 | 6/2003 |
| JP | 2004-210803 | 7/2004 |
| JP | 2004-212975 | 7/2004 |
| JP | 2004-341247 | 12/2004 |
| JP | 2004-361629 | 12/2004 |
| JP | 2005-099275 | 4/2005 |
| JP | 2005-105260 | 4/2005 |
| JP | 2005-189789 | 7/2005 |
| JP | 4510695 | 7/2010 |
| WO | WO 2004/069959 A2 | 8/2004 |

OTHER PUBLICATIONS

International Search Report in connection with corresponding PCT application No. PCT/JP2006/309924, dated Aug. 1, 2006.
Office Action issued in corresponding Japanese Patent Application No. 2005-212903, dated Nov. 9, 2010.

* cited by examiner

Primary Examiner—John S Chu
(74) Attorney, Agent, or Firm—Knobbe, Martens, Olson & Bear, LLP

(57) ABSTRACT

A method of forming a positive resist composition of the present invention includes a step (I) of passing a positive resist composition, which is obtained by dissolving a resin component (A) that displays increased alkali solubility under the action of acid and an acid generator component (B) that generates acid upon exposure in an organic solvent (S), through a filter (f1) equipped with a nylon membrane, wherein the resin component (A) is a copolymer containing at least two structural units obtained by polymerizing at least one monomer in the presence of acid. According to the present invention, it is possible to provide a method of producing a positive resist composition, a positive resist composition, and a method of forming a resist pattern that are capable of forming a resist pattern with reduced levels of both bridge-type defects and reprecipitation-type defects.

14 Claims, 3 Drawing Sheets

METHOD OF PRODUCING POSITIVE RESIST COMPOSITION, POSITIVE RESIST COMPOSITION, AND METHOD OF FORMING RESIST PATTERN

RELATED APPLICATIONS

This application is the U.S. National Phase filing under 35 U.S.C. §371 of PCT/JP2006/309924, filed May 18, 2006, which designated the United States and was published in a language other than English, which claims priority under 35 U.S.C. §119(a)-(d) to Japanese Patent Application No. 2005-212903, filed Jul. 22, 2005. The content of these applications is incorporated herein by reference in their entireties.

TECHNICAL FIELD

The present invention relates to a method of producing a positive resist composition, a positive resist composition, and a method of forming a resist pattern.

BACKGROUND ART

In recent years, in the production of semiconductor elements and liquid crystal display elements, advances in lithography techniques have lead to rapid progress in the field of miniaturization. Typically, these miniaturization techniques involve shortening the wavelength of the exposure light source. Conventionally, ultra violet radiation typified by g-line and i-line radiation has been used, but nowadays KrF excimer lasers (248 nm) are the main light source used in mass production, and ArF excimer lasers (193 nm) are now also starting to be introduced in mass production. Furthermore, research is also being conducted into lithography techniques that use $F_2$ excimer lasers (157 nm), EUV (extreme ultra violet radiation), and EB (electron beams) and the like as the light source (radiation source).

Resists for use with these types of short wavelength light sources require a high resolution capable of reproducing patterns of minute dimensions, and a high level of sensitivity relative to these types of short wavelength light sources.

One example of a known resist that satisfies these conditions is a chemically amplified resist, which includes a base resin and an acid generator (hereafter referred to as a PAG) that generates acid upon exposure. These chemically amplified resists include positive resists in which the alkali solubility of the exposed portions increases, and negative resists in which the alkali solubility of the exposed portions decreases.

Until recently, polyhydroxystyrene (PHS) or PHS-based resins in which the hydroxyl groups have been protected with acid-dissociable, dissolution-inhibiting groups, which exhibit a high degree of transparency relative to a KrF excimer laser (248 nm), have been used as the base resin of chemically amplified resists. However, because PHS-based resins contain aromatic rings such as benzene rings, their transparency relative to light with a wavelength shorter than 248 nm, such as light of 193 nm, is inadequate. Accordingly, chemically amplified resists that use a PHS-based resin as the base resin component suffer from low levels of resolution in processes that use light of 193 nm. As a result, resins that contain structural units derived from (meth)acrylate esters within the main chain (acrylic resins) are now widely used as the base resin for resists that use ArF excimer laser lithography or the like, as they offer excellent transparency in the vicinity of 193 nm (for example, see patent reference 1).

In addition to favorable levels of sensitivity and resolution, these types of resists also require favorable levels of other lithographic properties such as depth of focus (DOF) and resist pattern shape.

[Patent Reference 1]
Japanese Unexamined Patent Application, First Publication No. 2003-167347

DISCLOSURE OF INVENTION

In recent years, as the demands for higher resolution resist patterns have increased, in addition to the lithographic properties described above, an improvement in the level of defects (surface defects) is also now considered important. These defects refer to general abnormalities detected by inspection of the resist pattern following developing, from directly above the resist pattern, using a surface defect inspection device such as that manufactured by KLA Tencor Corporation (brand name: KLA). Examples of these abnormalities include post-developing scum, foam, dust, bridges across different portions of the resist pattern, color irregularities, and precipitated deposits. These defects become increasingly critical with reduced pattern dimensions, and addressing these defect problems is particularly desirable in the case of the formation of very fine resist patterns using an ArF excimer laser or more recent light source, namely an ArF excimer laser, a $F_2$ excimer laser, EUV or EB or the like.

As described above, defects appear in a variety of forms, and these forms can be divided into a number of groups based on the shape and cause of the defect. Specific examples include bridge-type defects which are formed when portions of the resist that should have been dissolved and removed by the developing solution are not completely removed and remain within the pattern (such as bridge structures that link portions of adjacent line patterns in a line and space pattern, or "Not Open" defects in which a portion of, or all of, a hole pattern is not open), and reprecipitation-type defects which are formed when resist components precipitate out during the developing process (including color irregularities such as "wine stains", and precipitated deposits).

However, until now, no known method has been capable of reducing both bridge-type defects and reprecipitation-type defects. The present invention addresses the circumstances described above, and has an object of providing a method of producing a positive resist composition, a positive resist composition and a method of forming a resist pattern, which are capable of forming resist patterns with reduced levels of both bridge-type defects and reprecipitation-type defects.

In order to achieve the above object, the present invention adopts the aspects described below.

Namely, a first aspect of the present invention is a method of producing a positive resist composition that includes a step (I) of passing a positive resist composition, which is obtained by dissolving a resin component (A) that displays increased alkali solubility under the action of acid and an acid generator component (B) that generates acid upon exposure in an organic solvent (S), through a filter (f1) equipped with a nylon membrane, wherein the resin component (A) is a copolymer containing at least two structural units obtained by polymerizing at least one monomer in the presence of acid.

Furthermore, a second aspect of the present invention is a positive resist composition obtained using the above method of producing a positive resist composition according to the first aspect.

Furthermore, a third aspect of the present invention is a method of forming a resist pattern that includes the steps of:

forming a resist film on a substrate using the positive resist composition according to the second aspect described above, exposing the resist film, and developing the resist film to form a resist pattern.

In this description and the appended claims, the term "structural unit" refers to a monomer unit that contributes to the formation of a polymer (a resin component).

The term "exposure" is used as a general concept that includes irradiation with any form of radiation.

According to the present invention, it is possible to provide a method of producing a positive resist composition, a positive resist composition, and a method of forming a resist pattern that are capable of forming resist patterns with reduced levels of both bridge-type defects and reprecipitation-type defects.

Figure 1:
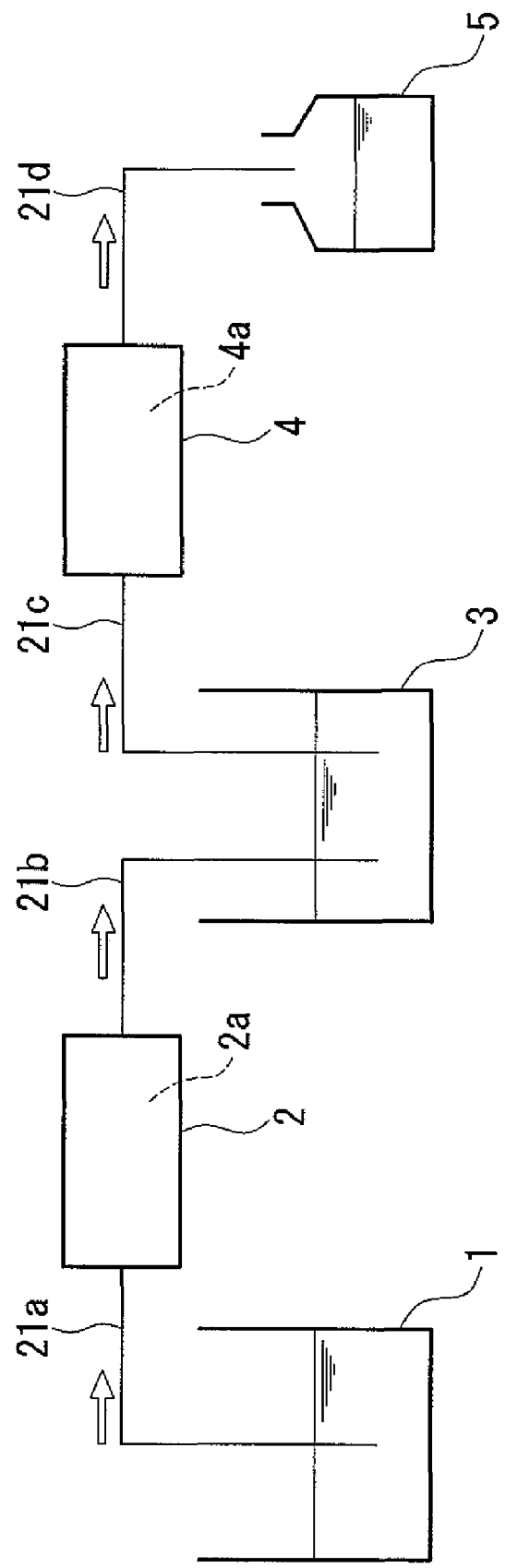
FIG. 1 is a schematic illustration showing an example of a filtering apparatus.

DESCRIPTION OF THE REFERENCE NUMERALS 1 represents a storage tank, 2 represents a first filtering unit, 2a represents a first filter, 3 represents a filtrate storage tank, 4 represents a second filtering unit, 4a represents a second filter, 5 represents a container, 6 represents a pressurization pipe, 7 represents a positive resist composition, 8 represents a storage unit, 9 represents a supply pipe, 10 represents a reservoir tank, 11 represents a pump, 12 represents a filtering unit (F1), 12a represents a filter (f1), 13 represents a nozzle, 14 represents a substrate, 15 represents a support, 16 represents a closed-base cylindrical body, 17 represents rotational axis, 18 represents a coating unit.

BEST MODE FOR CARRYING OUT THE INVENTION

<<Method of Producing Positive Resist Composition>>

A method of producing a positive resist composition according to the present invention must include a step (I) of passing a positive resist composition, which is obtained by dissolving a resin component (A) that displays increased alkali solubility under the action of acid (hereafter referred to as the component (A)) and an acid generator component (B) that generates acid upon exposure (hereafter referred to as the component (B)) in an organic solvent (S) (hereafter referred to as the component (S)), through a filter (f1) equipped with a nylon membrane.

In the present invention, the term "filter" refers to a device that includes at least a porous membrane that allows passage of the positive resist composition, and a support member that supports the membrane. Examples of this type of filter include filters of various materials and pore sizes for filtering ultra pure water, high-purity pharmaceuticals and fine chemicals, manufactured and marketed by filter manufacturers such as Pall Corporation, Advantec Toyo Co., Ltd., Mykrolis Corporation, and KITZ Corporation. In the present invention, there are no particular restrictions on the configuration of the filter, provided it is equipped with a membrane, and commonly used configurations such as disc type and cartridge type filters, in which the membrane is housed inside a container, can be used.

In the production method of the present invention, the "resist composition" passed through the filter includes not only resist compositions having the same solid fraction concentration as the product, but also so-called resist composition concentrates that have a higher solid fraction concentration than the product (for example, a solid fraction concentration within a range from approximately 8 to 15% by weight).

Furthermore, the term "filtration", as used in relation to the present invention, describes not only the typically used chemical meaning of the term ("the passage of only the fluid phase [either gaseous or liquid] through a membrane or phase formed from a porous substance, thereby separating a semi-solid phase or a solid from the fluid phase", Encyclopedia Chimica, vol. 9, published Jul. 31, 1962, Kyoritsu Shuppan Co., Ltd.), but also those cases where a substance is simply "passed through a filter", that is, cases where after passage of a substance through a membrane, a semisolid phase or solid material that has been trapped by the membrane may not necessarily be visible.

There are no particular restrictions on the filter (f1), and commercially available filters equipped with a nylon membrane can be used, including filters equipped with a nylon 6 membrane and filters equipped with a nylon 66 membrane.

The pore size of the nylon membrane used in the filter (f1) can be specified within a desired range using the nominal values reported by the filter manufacturers. This desired range can be adjusted appropriately with due consideration of the productivity and the effects of the present invention, by altering the filtering unit combination (the combination of factors such as the filter configuration, the type of membrane, and the number of times the composition is passed through the membrane).

From the viewpoint of the effects obtained, the pore size of the nylon membrane within the filter (f1) is preferably not more than 0.2 µm, even preferably not more than 0.1 µm, and is most preferably 0.04 µm or smaller.

However, if the pore size is too small, then the productivity (the throughput for the production and application of the resist composition) tends to fall, and consequently the lower limit for the pore size is preferably approximately 0.01 µm, and is even more preferably 0.02 µm. If due consideration is given to the defect reduction effect, the foreign matter improvement effect and the productivity, then the pore size of the membrane used in the filter (f1) is preferably within a range from 0.01 to 0.1 µm, even more preferably from 0.02 to 0.1 µm, and is most preferably from 0.02 to 0.04 µm. In terms of achieving a favorable combination of effects and productivity, a pore size of approximately 0.04 µm is the most desirable.

The nylon membrane of the filter (f1) preferably has a zeta potential within a range exceeding −20 mV but not more than 15 mV. By using a membrane with such a zeta potential, a favorable reduction can be achieved in the level of defects, and particularly the level of very fine bridge-type defects (microbridges). Furthermore, the quantity of foreign matter within the positive resist composition can also be reduced. Moreover, when a positive resist composition is filtered through such a membrane, the makeup of the positive resist composition displays minimal change following filtration, and a positive resist composition with excellent resist pattern size stability, which is resistant to variations in sensitivity and the resist pattern size, can be obtained.

In terms of maximizing the effects, the zeta potential of the nylon membrane of the filter (f1) is preferably greater than −20 mV but not more than 10 mV, and even more preferably greater than −20 mV and less than 10 mV, and is most preferably a negative value (although greater than −20 mV). This negative zeta potential is preferably greater than −20 mV but not more than −5 mV, and is even more preferably within a range from −10 to −18 mV, and is most preferably from −12 to −16 mV.

Here, the "zeta potential" refers to the electric potential of the diffuse ion layer generated around the periphery of a charged particle in a liquid. More specifically, if an ultra-fine powder displays a charge within a liquid, then an electrical double layer can be formed by oppositely charged ions which are electrostatically attracted to the powder in order to cancel out its charge. The potential at the outermost surface of this electrical double layer is the zeta potential. Measurement of the zeta potential is said to be effective in determining the surface structure of fine powders and fine particles.

In this description, the simplified term "zeta potential" describes the "zeta potential in distilled water of pH 7.0", and the numerical values for the zeta potential are the nominal values provided by the filter manufacturers.

Of those membranes with a zeta potential within the range specified above, common examples of filters equipped with a membrane having a positive zeta potential include filters equipped with a polyamide membrane manufactured from either nylon 6 that has undergone charge modification or nylon 66 that has undergone charge modification.

Furthermore, examples of filters equipped with a membrane having a negative zeta potential include the Ultipore N66 filter (a product name, manufactured by Pall Corporation, zeta potential: approximately −12 to −16 mV), which is manufactured from nylon 66 that has not been subjected to charge modification, and the Ultipleat (a registered trademark) P-Nylon filter (a product name: manufactured by Pall Corporation, a flat membrane-type filter, zeta potential: approximately −12 to −16 mV, pore size: 0.04 μm), which is manufactured from nylon 66 that has not been subjected to charge modification.

In this description, "charge modification" has the same meaning as the expression forced potential modification, and the existence or absence of charge modification correlates with the zeta potential value.

Membranes that have not been subjected to charge modification are preferred as the membrane for the filter (f1).

Moreover, in the filter (f1), the nylon membrane preferably has a critical surface tension of 70 dyne/cm or greater, as such values yield superior effects for the present invention. The upper limit for the critical surface tension is preferably not more than 95 dyne/cm, as higher values can cause a deterioration in the defect reduction effect. Particularly preferred critical surface tension values are within a range from at least 75 dyne/cm to not more than 90 dyne/cm, and the most desirable values are from at least 75 dyne/cm to not more than 80 dyne/cm.

The "critical surface tension" is a property that is widely referred to as the "wetting characteristic" of a polymer surface, and refers to the surface tension ($\gamma c$) of a solid. Unlike a liquid, this $\gamma c$ value cannot be evaluated directly, and is instead determined in the manner described below, using the Young-Dupre formula and a Zisman plot that is described below.

Young Dupre Formula: $\gamma LV \cos \theta = \gamma SV - \gamma SL$

In this formula, $\theta$ represents the contact angle, S is a solid, L is a liquid, and V is a saturated vapor. When water is used as the liquid, $\theta$ is 90°, and when $\theta$ exceeds 90° the surface is hydrophobic, whereas surfaces in which $\theta$ is close to 0° are hydrophilic.

Figure 2:
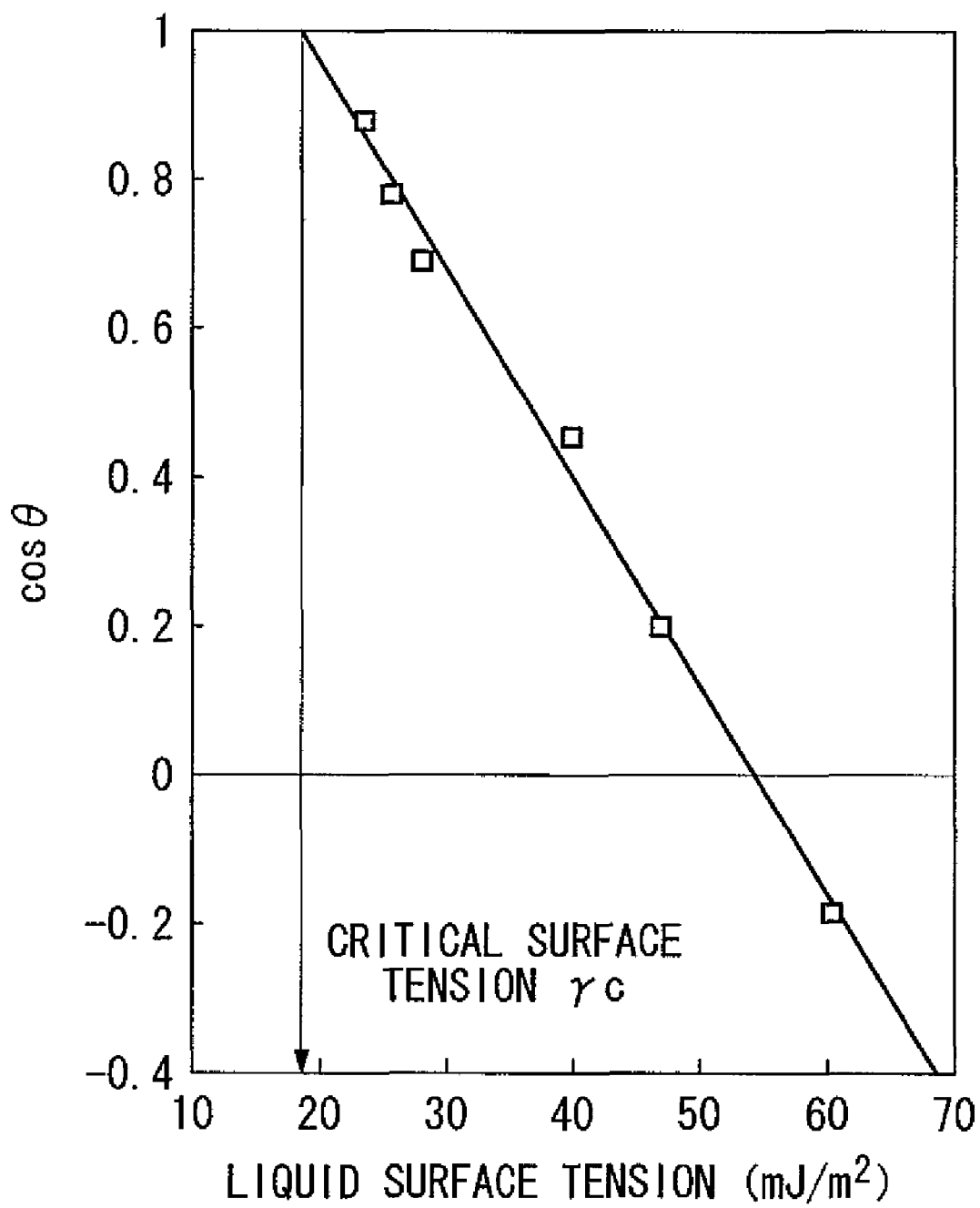
FIG. 2 is a graph showing a Zisman Plot.

Zisman Plot (see FIG. 2): Using liquids with a variety of different surface tension values $\gamma LV$, the contact angle $\theta$ is measured, and a plot is produced of $\gamma LV$ vs. $\cos \theta$. As the value of $\gamma LV$ approaches the value of $\gamma SV$ of the solid surface, the value of $\theta$ decreases, and at a certain value of $\gamma LV$, the contact angle $\theta$ becomes 0°. This value of $\gamma LV$ for the liquid where $\theta = 0°$ is defined as the solid surface tension, that is, the critical surface tension ($\gamma c$).

The critical surface tension $\gamma c$ refers to the critical surface tension at the membrane, and is not the value for the polymer material (the material). In other words, the polymer material (the material), and the membrane of the filter prepared by processing the material to enable it to function as a filter (the medium) usually exhibit different $\gamma c$ values.

For materials (polymer materials) typically used in producing filters, examples of the $\gamma c$ values for the membrane (the processed membrane for use in a filter) (the medium), and the original polymer material prior to its use within the filter (prior to being processed for use within the filter) (the material) are listed below.

—Nylon

For example, in the case of nylon 66, the $\gamma c$ value for a membrane of nylon 66 within a filter (a medium) is 77 dyne/cm (hereafter, units are omitted), whereas the $\gamma c$ value for typical nylon 66 that is not installed within a filter (a material) is 46.

—Polyethylene

The $\gamma c$ value for a membrane of polyethylene within a filter (a medium) is 36.

—Polypropylene

The $\gamma c$ value for a membrane of polypropylene within a filter (a medium) is 36.

—Fluororesins

For example, in the case of polytetrafluoroethylene (PTFE), the $\gamma c$ value for a membrane of PTFE within a filter (a medium) is 28, whereas the $\gamma c$ value for typical PTFE that is not installed within a filter (a material) is 18.5.

This difference in critical surface tension values between the polymer material and the membrane used within the filter arises as a result of processing of the polymer material (the material) to enable its use within the filter.

In this manner, even with the same starting material, if the nature of the processing is altered, then the critical surface tension value will also differ, and consequently the critical surface tension for a filter membrane is preferably determined by confirming the nominal value or determining a measured value. Use of the nominal critical surface tension values provided by the filter manufacturers is the simplest option, although a measured value for the critical surface tension can also be determined relatively easily by preparing a plurality of liquids with known surface tension values, and then dripping each of these liquids onto the target membrane, and determining the boundary between those liquids that penetrate the membrane under their own weight, and those liquids That do not penetrate.

The surface area (filtration area) and filtration pressure [differential pressure resistance] for the filter (f1), and the flow rate with which the positive resist composition passes through the filter (f1) are preferably adjusted in accordance with factors such as the quantity of the positive resist composition being processed, and there are no particular restrictions on these settings.

The present invention may also include a step (II) of passing the positive resist composition through a filter (f2) equipped with a polyethylene or polypropylene membrane, which may be conducted before and/or after the step (I). Although this step (II) is not essential, inclusion of the step (II) is preferred as it further improves the effects of the present invention. Conducting a filtering step using a filter (f2) after completion of the step (I) is particularly desirable, as it yields particularly favorable effects for the present invention. Furthermore, although the membrane may be either a flat membrane or a hollow thread membrane, a hollow thread membrane is preferred as it yields superior effects for the present invention.

There are no particular restrictions on the filter (f2), provided it is equipped with a polyethylene or polypropylene membrane, and filters used in conventional resist composition filtering applications can be used. Polypropylene membranes include not only membranes of common polypropylene, but also membranes of high density polypropylene (HDPP) and ultra high molecular weight polypropylene (UPP).

A specific example of a polyethylene filter is the "Microguard UPE filter" (a product name, manufactured by Mykrolis Corporation).

A specific example of a polypropylene filter is the "Polyfix" (a product name, manufactured by KITZ Corporation).

The pore size of the membrane used in the filter (f2) can be specified within a desired range using the nominal values reported by the filter manufacturers. This desired range can be adjusted appropriately with due consideration of the productivity and the effects of the present invention, by altering the filtering unit combination (the combination of factors such as the filter configuration, the type of membrane, and the number of times the composition is passed through the membrane).

From the viewpoint of the effects obtained, the pore size of the membrane within the filter (f2) is preferably not more than 0.2 μm, even preferably not more than 0.1 μm, and is most preferably 0.04 μm or smaller.

However, if the pore size is too small, then the productivity (the throughput for the production and application of the resist composition) tends to fall, and consequently the lower limit for the pore size is preferably approximately 0.01 μm, and is even more preferably 0.02 μm or greater. If due consideration is given to the defect reduction effect, the foreign matter improvement effect and the productivity, then the pore size of the membrane used in the filter (f2) is preferably within a range from 0.01 to 0.1 μm, and is even more preferably from 0.01 to 0.04 μm. In terms of achieving a favorable combination of effects and productivity, a pore size of approximately 0.02 μm is the most desirable.

The surface area (filtration area) and filtration pressure [differential pressure resistance] for the filter (f2), and the flow rate with which the positive resist composition passes through the filter (f2) are preferably adjusted in accordance with factors such as the quantity of the positive resist composition being processed, and there are no particular restrictions on these settings.

The present invention may also include a step (III) of passing the positive resist composition through a filter (f3) different from the filter (f1) and the filter (f2), which may be conducted before and/or after the step (I).

Conventional filters equipped with a membrane formed from a material other than nylon, polyethylene or polypropylene can be used as the filter (f3), and filters equipped with a membrane formed from a fluororesin such as polytetrafluoroethylene (PTFE) are particularly preferred.

Specific examples of filters equipped with a fluororesin membrane include the Emflon filter (a product name: manufactured by Pall Corporation, a flat membrane-type filter, zeta potential: −20 mV, pore size: 0.05 μm), which is manufactured from PTFE, and the FluoroLine filter (a product name: manufactured by Mykrolis Corporation, a flat membrane-type filter, pore size: 0.03 μm), which is also manufactured from PTFE.

The pore size of the membrane used in the filter (f3) can be specified within a desired range using the nominal values reported by the filter manufacturers. This desired range can be adjusted appropriately with due consideration of the productivity and the effects of the present invention, by altering the filtering unit combination (the combination of factors such as the filter configuration, the type of membrane, and the number of times the composition is passed through the membrane).

From the viewpoint of the effects obtained, the pore size of the membrane within the filter (f3) is preferably not more than 0.2 μm, even preferably not more than 0.1 μm, and is most preferably 0.05 μm or smaller.

However, if the pore size is too small, then the productivity (the throughput for the production and application of the resist composition) tends to fall, and consequently the lower limit for the pore size is preferably approximately 0.01 μm, and is even more preferably 0.02 μm or greater. If due consideration is given to the defect reduction effect, the foreign matter improvement effect and the productivity, then the pore size of the membrane used in the filter (f3) is preferably within a range from 0.01 to 0.1 μm, even more preferably from 0.02 to 0.1 μm, and is most preferably from 0.02 to 0.06 μm. In terms of achieving a favorable combination of effects and productivity, a pore size of approximately 0.05 μm is the most desirable.

The surface area (filtration area) and filtration pressure [differential pressure resistance] for the filter (f3), and the flow rate with which the positive resist composition passes through the filter (f3) are preferably adjusted in accordance with factors such as the quantity of the resist composition being processed, and there are no particular restrictions on these settings.

As follows is a description of an embodiment of the method of producing a positive resist composition according to the present invention.

An example of a filtering apparatus that can be used favorably within this embodiment is shown in FIG. 1. This filtering apparatus includes a first filtering unit 2 equipped with a first filter 2a, and a second filtering unit 4 equipped with a second filter 4a.

Furthermore, the above filtering apparatus also contains a storage tank 1 for storing the positive resist composition prepared by dissolving the component (A) and the component (B) in the component (S), and a filtrate storage tank 3 that stores the positive resist composition that has passed through the first filtering unit 2, wherein the storage tank 1 and the first filtering unit 2, the first filtering unit 2 and the filtrate storage tank 3, and the filtrate storage tank 3 and the second filtering unit 4 are connected via flow passages 21a, 21b and 21c respectively. Furthermore, the second filtering unit 4 is connected to a flow passage 21d that feeds the positive resist composition that has passed through the second filtering unit 4 into a container 5.

In this embodiment, at least one of the first filter 2a and the second filter 4a must be a filter (f1) equipped with a nylon membrane. By employing such a configuration, the positive resist composition can be passed, at least once, through the filter (f1), and this enables a positive resist composition to be obtained in which the occurrence of bridge-type defects has been suppressed.

When using this type of filtering apparatus, the positive resist composition can be produced in the manner described below. First, a positive resist composition is prepared that includes the component (A), the component (B) and the component (S), and this positive resist composition is supplied from the storage tank 1 (the storage unit for the positive resist composition) to the first filtering unit 2. As a result, the positive resist composition passes through, and is filtered by, the first filter 2a contained within the first filtering unit 2, and then enters the filtrate storage tank 3.

Subsequently, the filtrate (the positive resist composition) is supplied from the filtrate storage tank 3 to the second filtering unit 4, meaning the positive resist composition passes through, and is filtered by, the second filter 4a contained within the second filtering unit 4. Finally, the resulting filtrate (the positive resist composition) enters the container 5 as a final product.

During this method, the step (I) may be conducted using the filter (f1) as the first filter 2a, and a post-filtering step then conducted using the filter (f2) as the second filter 4a, or alternatively, the step (I) may be conducted using the filter (f2) as the second filter 4a, and a pre-filtering step conducted prior to this step using the filter (f2) as the first filter 2a.

Furthermore, both the first filter 2a and the second filter 4a may be filters (f1). In such cases, the composition can be easily passed twice or more through the filters (f1). If normal methods are used to form an apparatus in which the solution undergoing treatment (the positive resist composition) is passed through the above filters and the resulting filtrate is then recirculated and passed through the same filters a second time, then the positive resist composition can be easily passed through the filters a plurality of times.

Furthermore, by using the filter (f1) as the second filter 4a, and supplying the positive resist composition directly from the storage tank 1 to the second filter 4a, a single occurrence of the step (I) can be conducted in isolation, with no pre-filtering or post-filtering step. Furthermore, the step (I) can also be conducted in isolation by using the filter (f1) as the first filter 2a, and not providing a filter within the second filtering unit 4.

There are no particular restrictions on the number of times the composition is passed through a single filter (the filter (f1) or filter (f2)), or on the types of filter (f2) that can be combined with the filter (f1), and these factors can be selected in accordance with the desired objectives.

The filtering apparatus is not limited to the embodiment shown in FIG. 1, and various different modes can be employed, provided the filter (f1) is provided within the flow path for the positive resist composition. For example, a third filtering unit may be provided downstream from the second filtering unit 4, and in such a case, a pre-filtering step, the step (I), and a post-filtering step can be conducted by passing the positive resist composition through a first filtering unit 2 containing the filter (f1), a second filtering unit 4 containing the filter (f2), and a third filtering unit containing the filter (f3).

In the production method of the present invention, an applicator such as a spinner or a coater-developer fitted with a filtering apparatus containing the filter (f1) can also be used. In such a case, the steps of producing the positive resist composition and subsequently applying the prepared positive resist composition to a substrate to form a resist film can be conducted within a single apparatus.

There are no particular restrictions on this type of applicator fitted with a filtering apparatus, and suitable applicators include not only devices that possess only an application function such as a spinner, but also applicators such as coater-developers that are integrated with another device such as a developer.

This type of applicator usually has a coating unit equipped with a nozzle or the like, and is usually configured so that within this coating unit, the positive resist composition is supplied from the nozzle onto a wafer (a substrate), with the positive resist composition coating the surface of the wafer. Accordingly, in an applicator for use with the present invention, by incorporating the filtering apparatus within an aforementioned applicator or the like, so that prior to supply from the nozzle to the wafer surface, the positive resist composition passes through the membrane of the filtering apparatus, those substances within the positive resist composition that can cause defects are removed prior to supply of the positive resist composition to the wafer. As a result, a superior reduction in the level of defects, and particularly in the level of bridge-type defects, and excellent stability in the resist pattern size can be achieved.

When an applicator is configured in this manner, the filter is preferably removable from the applicator. In other words, in the applicator fitted with a filtering apparatus, a mode is preferably adopted in which the filter can be removed and replaced separately from other components.

Figure 3:
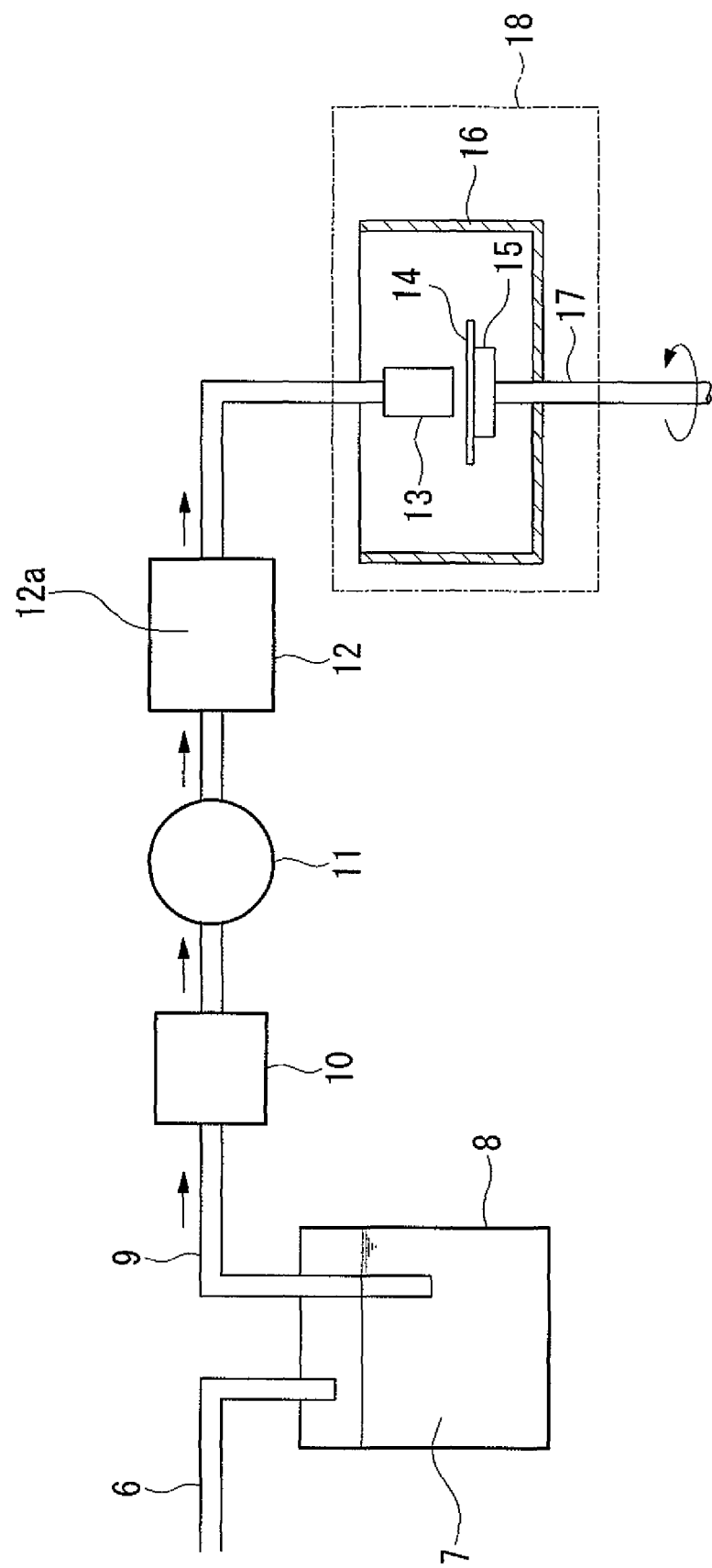
FIG. 3 is a schematic illustration showing an example of an applicator fitted with a filtering apparatus.

FIG. 3 shows a schematic illustration of one example of the applicator.

This applicator includes a storage unit 8 that stores the positive resist composition, a reservoir tank 10, a filtering unit (F1) 12 containing a filter (f1) 12a, and a coating unit 18.

A pressurization pipe 6 is provided in the storage unit 8, and by pressurizing the positive resist composition 7 inside the storage unit 8 with an inert gas such as nitrogen, the positive resist composition 7 can be supplied from the storage unit 8 to the reservoir tank 10.

The coating unit 18 contains a nozzle 13, a support 15 for positioning the substrate, and a rotational axis 17, the tip of which is attached to the support 15. A closed-base cylindrical body 16 (a protective wall) is provided around the periphery of the nozzle 13 and the support 15, and the rotational axis 17 penetrates through the base of this cylindrical body. When the substrate 14 is rotated by rotating the support 15, the closed-base cylindrical body 16 prevents the positive resist composition on the substrate 14 from splattering.

This applicator can be used, for example, in the manner described below.

First, the positive resist composition 7 stored in the storage unit 8 is supplied from the storage unit 8, via an inlet pipe 9, to the reservoir tank 10. The positive resist composition is suctioned by a pump 11 and supplied to the first filtering unit 12, and is filtered by passage through the filter (f1) 12a provided inside the filtering unit (F1) 12. Having passed through the filtering unit (F1) 12, the positive resist composition is supplied from the nozzle 13 of the coating unit 18 onto the substrate 14 such as a silicon wafer or the like. By rotating the rotational axis 17 within the coating unit 18 during this process, the support 15 attached to the tip of the rotational axis 17 rotates the substrate 14 positioned on top of the support. The resulting centrifugal force causes the positive resist composition dripped onto the surface of the substrate 14 to spread outwards, thereby coating the surface of the substrate 14.

The reservoir tank 10 may be either included or excluded. Furthermore, there are no particular restrictions on the pump 11, provided it is capable of supplying the positive resist composition from the storage unit 8 to the coating unit 18.

Furthermore, a second filtering unit containing a filter (f2) may be provided either prior to, and/or after the filtering unit (F1) 12. The specific combination of the filter (f1) and the filter (f2) can be selected as desired from a variety of possible embodiments.

Furthermore, in the above description a spinner was described as one example of the applicator, but in recent years, a variety of non-rotational coating methods such as the slit nozzle method have been proposed, and because a variety of devices have been proposed for executing these methods, there are no particular restrictions on the coating method.

Furthermore, as mentioned above, the applicator may also be a so-called coater-developer in which the subsequent developing step is also conducted within the one device. Examples of this type of device include the Clean Track ACT-8 (a product name), and the Clean Track ACT-12 (a product name), both manufactured by Tokyo Electron Co., Ltd.

[Positive Resist Composition used in the above Method of Producing a Positive Resist Composition]

The positive resist composition used in the above method of producing a positive resist composition is a so-called chemically amplified resist composition prepared by dissolving at least the component (A) and the component (B) in the component (S).

In this positive resist composition, including the component (A) that displays increased alkali solubility under the action of acid together with the component (B) means that when the acid generated from the component (B) upon exposure acts upon the component (A), the alkali solubility of the component (A) increases, causing a change from an alkali-insoluble state to an alkali-soluble state. As a result, when the resist film obtained using the positive resist composition is selectively exposed during the formation of a resist pattern, or alternatively, is exposed and then subjected to post exposure baking (PEB), the exposed portions of the resist shift to an alkali-soluble state, whereas the unexposed portions remain insoluble in alkali, meaning that alkali developing can then be used to form a positive resist pattern.

The production method of the present invention is suited to treatment of this type of positive resist composition.

<Component (A)>

The component (A) is a copolymer containing at least two structural units obtained by polymerizing at least one monomer in the presence of an acid.

The component (A) preferably contains a structural unit (a1) derived from an ($\alpha$-lower alkyl)acrylate ester within the main chain, as such structures exhibit excellent transparency to short wavelength light sources with wavelengths of 200 nm or less, such as an ArF excimer laser (193 nm), and also enable the formation of high-resolution resist patterns.

In the component (A), the proportion of the structural unit (a1) derived from an ($\alpha$-lower alkyl) acrylate ester, relative to the combined total of all the structural units that constitute the component (A), is preferably at least 20 mol %, even more preferably 50 mol % or greater, and is most preferably 70 mol % or greater.

In this description and the appended claims, the term "($\alpha$-lower alkyl)acrylate ester" is a generic term that includes either one of, or both, $\alpha$-lower alkyl acrylate esters such as a methacrylate ester, and an acrylate ester.

The term "$\alpha$-lower alkyl acrylate ester" refers to a structure in which the hydrogen atom bonded to the $\alpha$-carbon atom of an acrylate ester has been substituted with a lower alkyl group.

The expression "structural unit derived from an ($\alpha$-lower alkyl)acrylate ester" refers to a structural unit with a structure formed by the cleavage of the ethylenic double bond of the ($\alpha$-lower alkyl)acrylate ester.

The expression "contains a structural unit (a1) derived from an ($\alpha$-lower alkyl) acrylate ester within the main chain" means that the two carbon atoms within the structural unit (a1) derived from the ethylenic double bond of the ($\alpha$-lower alkyl)acrylate ester form part of the main chain of the copolymer.

Unless stated otherwise, the term "alkyl group" includes straight-chain, branched-chain and cyclic monovalent saturated hydrocarbon groups.

Examples of the lower alkyl groups that may be bonded to the $\alpha$-position of the ($\alpha$-lower alkyl)acrylate ester include alkyl groups of 1 to 5 carbon atoms, and specific examples include straight-chain and branched-chain lower alkyl groups such as a methyl group, ethyl group, propyl group, isopropyl group, n-butyl group, isobutyl group, tert-butyl group, pentyl group, isopentyl group and neopentyl group. From the viewpoint of industrial availability, a hydrogen atom or methyl group is preferably bonded to the $\alpha$-position.

In the case where the component (A) is a resin containing a structural unit (a1) derived from an ($\alpha$-lower alkyl)acrylate ester within the main chain, the one or more monomers used in forming this component (A) must include at least one ($\alpha$-lower alkyl)acrylate ester.

Furthermore, by conducting the polymerization of the one or more monomers including at least one ($\alpha$-lower alkyl) acrylate ester in the presence of an acid, the acid acts upon the ($\alpha$-lower alkyl)acrylate ester prior to polymerization and/or upon the structural unit (a1) within the polymer generated by polymerization of the monomer(s), thereby causing a dissociation of the ester terminal portion, and yielding a copolymer containing both the structural unit (a1), and a structural unit (a2) derived from an ($\alpha$-lower alkyl)acrylic acid.

In other words, in those cases where the acid acts upon the ($\alpha$-lower alkyl)acrylate ester prior to polymerization, an ($\alpha$-lower alkyl)acrylic acid is formed, and that ($\alpha$-lower alkyl)acrylic acid then undergoes polymerization together with the ($\alpha$-lower alkyl)acrylate ester, yielding a copolymer containing the structural unit (a1) and the structural unit (a2).

On the other hand, in those cases where the acid act upon the structural unit (a1) within the polymer generated by polymerization of the one or more monomers including the ($\alpha$-lower alkyl)acrylate ester, a portion of the structural units (a1) are converted to structural units (a2), resulting in the formation of a similar copolymer to that described above, containing the structural unit (a1) and the structural unit (a2).

The structural unit (a1) can be represented by a general formula (a-1) shown below, wherein R represents a hydrogen atom or a lower alkyl group, and X represents a monovalent organic group.

Furthermore, the expression "ester terminal portion" refers to the group X in the general formula (a-1) shown below. In other words, the "ester terminal portion" refers to the group bonded to the oxygen atom that is adjacent to the carbonyl group within the $\alpha$-lower alkyl)acrylate ester.

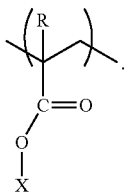

(a-1)

In the above formula, the lower alkyl group represented by R is an alkyl group of 1 to 5 carbon atoms, and specific examples include straight-chain and branched-chain lower alkyl groups such as a methyl group, ethyl group, propyl group, isopropyl group, n-butyl group, isobutyl group, tert-butyl group, pentyl group, isopentyl group and neopentyl group. From the viewpoint of industrial availability, a hydrogen atom or methyl group is preferably bonded to the α-position.

In the present invention, an "organic group" is a group that contains a carbon atom and may also include atoms other than the carbon atom (such as a hydrogen atom, oxygen atom, nitrogen atom, sulfur atom or halogen atom (such as a fluorine atom or chlorine atom)). There are no particular restrictions on the monovalent organic group represented by X, and examples include the ester terminal portions of the (α-lower alkyl)acrylate esters of the structural units (a11) to (a14) described below (such as acid-dissociable, dissolution-inhibiting groups, lactone-containing monocyclic or polycyclic groups, polar group-containing aliphatic hydrocarbon groups, and polycyclic aliphatic hydrocarbon groups).

Furthermore, in the present invention, the structural unit (a2) can also be represented by the above general formula (a-1), wherein R represents a hydrogen atom or a lower alkyl group, and X represents a hydrogen atom. The structural unit (a2) is preferably a structural unit represented by a general formula (4) shown below.

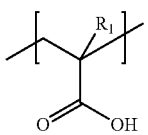

(4)

(wherein, $R_1$ represents a hydrogen atom or a methyl group)

The structural unit (a2) includes not only structural units formed by cleavage of the ethylenic double bond of an (α-lower alkyl)acrylic acid during polymerization, but also structural units formed following polymerization, by the acid acting upon the ester terminal portion of a structural unit derived from an (α-lower alkyl)acrylate ester within the component (A), thereby causing the acid-dissociable, dissolution-inhibiting group to dissociate.

In the present invention, the structural unit (a2) is preferably at least one unit selected from the group consisting of structural units (a2"-1) derived from an α-lower alkyl)acrylic acid produced by dissociation of the ester terminal portion of an α-lower alkyl)acrylate ester under the action of the aforementioned acid, and structural units (a2"-2) produced by dissociation of the ester terminal portion of a structural unit derived from an (α-lower alkyl)acrylate ester under the action of the aforementioned acid.

Furthermore, the structural unit (a2) is preferably at least one unit selected from the group consisting of structural units (a2"-1-1) derived from an (α-lower alkyl)acrylic acid produced by dissociation, under the action of the aforementioned acid, of the acid-dissociable, dissolution-inhibiting group of an (α-lower alkyl)acrylate ester that gives rise to a structural unit (a11) described below, and structural units (a2"-2-1) produced by dissociation of the acid-dissociable, dissolution-inhibiting group of a structural unit (a11) under the action of the aforementioned acid.

In the present invention, the combined quantity of the structural unit (a1) and the structural unit (a2) within the component (A), relative to the combined total of all the structural units that constitute the component (A), is preferably within a range from 50 to 100 mol %, and is even more preferably from 80 to 100 mol %. A quantity within this range enables a positive resist composition to be obtained that exhibits a high degree of transparency to ArF excimer lasers and more recent light sources, and also exhibits excellent lithographic properties.

Furthermore, in terms of achieving superior effects for the present invention, the proportion of the structural unit (a2) within the component (A), relative to the combined total of all the structural units that constitute the component (A), is preferably within a range from 1 to 20 mol %, even more preferably from 2 to 15 mol %, even more preferably from 2 to 10 mol %, and is most preferably from 2 to 6 mol %. Provided the proportion of the structural unit (a2) is 1 mol % or higher, a favorable defect reduction effect is obtained, whereas a proportion of not more than 20 mol % yields more favorable lithographic properties.

—Structural Unit (a11)

In the present invention, the component (A) preferably includes, as the structural unit (a1), a structural unit (a11) derived from an (α-lower alkyl)acrylate ester containing an acid-dissociable, dissolution-inhibiting group. In other words, the component (A) is preferably a copolymer containing the structural unit (a11) and the structural unit (a2).

Examples of the lower alkyl group that functions as the substituent at the α-position of the (α-lower alkyl)acrylate ester include the same lower alkyl groups as those exemplified above for the group R within the general formula (a-1).

The acid-dissociable, dissolution-inhibiting group in the structural unit (a11) can use any of the groups that have been proposed as acid-dissociable, dissolution-inhibiting groups for the base resins of chemically amplified resists, provided the group exhibits an alkali dissolution-inhibiting effect that renders the entire component (A) insoluble in alkali prior to dissociation, but then causes the entire component (A) to become alkali-soluble upon dissociation. Generally, groups that form either a cyclic or chain-like tertiary alkyl ester or groups that form a cyclic or chain-like alkoxyalkyl ester with the carboxyl group of the (meth)acrylate acid are the most widely known. Here, the term "(meth)acrylate ester" is a generic term that includes both the acrylate ester and the methacrylate ester.

Here, a tertiary alkyl ester describes a structure in which an ester is formed by substituting the hydrogen atom of a carboxyl group with an alkyl group or a cycloalkyl group, and a tertiary carbon atom within the alkyl group or cycloalkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The alkyl group or cycloalkyl group may contain a substituent group.

Hereafter, for the sake of simplicity, groups that exhibit acid dissociability as a result of the formation of a tertiary alkyl ester at a carboxyl group are referred to as "tertiary alkyl ester-based acid-dissociable, dissolution-inhibiting groups".

Furthermore, a cyclic or chain-like alkoxyalkyl ester describes a structure in which an ester is formed by substituting the hydrogen atom of a carboxyl group with an alkoxyalkyl group, wherein the alkoxyalkyl group is bonded to the oxygen atom at the terminal of the carbonyloxy group (—C(O)—O—). In this alkoxyalkyl ester, the action of acid causes cleavage of the bond between the oxygen atom and the alkoxyalkyl group.

As the structural unit (a11), the use of one or more structural units selected from the group consisting of structural units represented by a general formula (a1-0-1) shown below and structural units represented by a general formula (a1-0-2) shown below is particularly preferred.

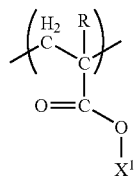

(a1-0-1)

(wherein, R represents a hydrogen atom or a lower alkyl group; and X represents an acid-dissociable, dissolution-inhibiting group)

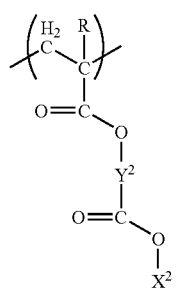

(a1-0-2)

(wherein, R represents a hydrogen atom or a lower alkyl group; $X^2$ represents an acid-dissociable, dissolution-inhibiting group; and $Y^2$ represents an aliphatic cyclic group)

In the general formula (a1-0-1), R is as defined above.

There are no particular restrictions on $X^1$ and $X^2$ provided they function as acid-dissociable, dissolution-inhibiting groups, and suitable examples include alkoxyalkyl groups and tertiary alkyl ester-based acid-dissociable, dissolution-inhibiting groups, and of these, tertiary alkyl ester-based acid-dissociable, dissolution-inhibiting groups are preferred.

Examples of these tertiary alkyl ester-based acid-dissociable, dissolution-inhibiting groups include aliphatic branched-chain acid-dissociable, dissolution-inhibiting groups and acid-dissociable, dissolution-inhibiting groups that contain an aliphatic cyclic group.

The number of carbon atoms with $X^1$ and $X^2$ is preferably within a range from 4 to 30.

In this description and the appended claims, the term "aliphatic" is a relative concept used in relation to the term "aromatic", and defines a group or compound or the like that contains no aromaticity. The term "aliphatic cyclic group" describes a monocyclic or polycyclic group that contains no aromaticity.

The "aliphatic cyclic group" within the structural unit (a11) may either contain, or not contain, substituent groups. Examples of suitable substituent groups include lower alkyl groups of 1 to 5 carbon atoms, a fluorine atom, fluorinated lower alkyl groups of 1 to 5 carbon atoms that have undergone substitution with a fluorine atom, and an oxygen atom (=O) and the like.

The basic ring structure of the "aliphatic cyclic group" excluding substituent groups is not restricted to groups formed solely from carbon and hydrogen (hydrocarbon groups), although a hydrocarbon group (an alicyclic hydrocarbon group) is preferred. Furthermore, the "hydrocarbon group" may be either saturated or unsaturated, but is typically saturated. A polycyclic group is preferred.

The number of carbon atoms within the aliphatic cyclic group is preferably from 6 to 12.

Examples of this type of aliphatic cyclic group include groups in which one or more hydrogen atoms have been removed from a monocycloalkane or a polycycloalkane such as a bicycloalkane, tricycloalkane or tetracycloalkane, which may, or may not, be substituted with a lower alkyl group, a fluorine atom or a fluorinated lower alkyl group. Specific examples of suitable groups include groups in which one or more hydrogen atoms have been removed from a monocycloalkane such as cyclopentane or cyclohexane, or a polycycloalkane such as adamantane, norbornane, isobornane, tricyclodecane or tetracyclododecane.

Specific examples of the structural unit derived from an (α-lower alkyl)acrylate ester containing a tertiary alkyl ester-based acid-dissociable, dissolution-inhibiting groups include the structural units represented by a general formula (1) shown below.

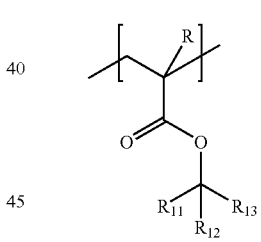

(1)

(wherein, R represents a hydrogen atom or a methyl group, $R_{11}$ represents an alkyl group of 1 to 4 carbon atoms, and $R_{12}$ and $R_{13}$ each represent, independently, a straight-chain or branched alkyl group of 1 to 12 carbon atoms, or an alicyclic hydrocarbon group containing a monocyclic or bridged cyclic structure, or alternatively, $R_{12}$ and $R_{13}$ may be bonded together to form an alicyclic hydrocarbon group of 4 to 24 carbon atoms)

Specific examples of suitable aliphatic branched-chain acid-dissociable, dissolution-inhibiting groups include a tert-butyl group and a tert-amyl group.

Furthermore, examples of suitable acid-dissociable, dissolution-inhibiting groups that contain an aliphatic cyclic group include groups that contain a tertiary carbon atom within the ring skeleton of a cycloalkyl group, and specific examples include a 2-methyl-2-adamantyl group and 2-ethyl-2-adamantyl group. Other possible groups include those that contain an aliphatic cyclic group such as an adamantyl group, and a branched-chain alkylene group that contains a tertiary carbon atom and is bonded to the aliphatic cyclic group, such as the group shown within the structural unit represented by a general formula (a1-1-03) shown below, and structural units represented by a general formula (a1-1-04) shown below are particularly desirable.

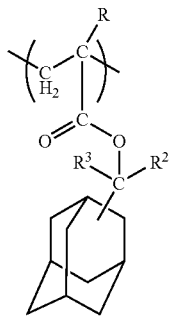

(a1-1-03)

(wherein, R represents a hydrogen atom or a lower alkyl group, and $R^2$ and $R^3$ each represent, independently, a lower alkyl group, and preferably a group containing from 1 to 5 carbon atoms)

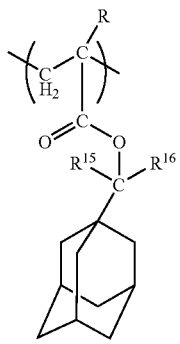

(a1-1-04)

[wherein, R is as defined above, and $R^{15}$ and $R^{16}$ each represent, independently, a lower alkyl group (which may be either a straight-chain or branched-chain group, and preferably contains from 1 to 5 carbon atoms)]

As the aforementioned alkoxyalkyl group, groups represented by a general formula shown below are preferred.

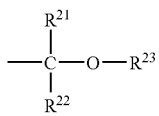

(wherein, $R^{21}$ and $R^{22}$ each represent, independently, an alkyl group or a hydrogen atom, and $R^{23}$ represents an alkyl group or a cycloalkyl group. Furthermore, $R^{21}$ and $R^{23}$ may be bonded together at their respective terminals to form a ring)

The number of carbon atoms within a lower alkyl group of the groups $R^{21}$ and $R^{22}$ is preferably within a range from 1 to 15, and the group may be either a straight-chain or branched-chain group, although an ethyl group or methyl group is preferred, and a methyl group is the most desirable. Those cases in which one of the groups $R^{21}$ ad $R^{22}$ is a hydrogen atom and the other is a methyl group are particularly desirable.

$R^{23}$ is an alkyl group or a cycloalkyl group, the number of carbon atoms within the group is preferably within a range from 1 to 15, and the group may be a straight-chain, branched-chain or cyclic group. In those cases where $R^{23}$ is a straight-chain or branched-chain group, the number of carbon atoms is preferably from 1 to 5, an ethyl group or methyl group is preferred, and an ethyl group is particularly desirable.

In those cases where $R^{23}$ is a cyclic group, the number of carbon atoms is preferably within a range from 4 to 15, even more preferably from 4 to 12, and is most preferably from 5 to 10. Specific examples of this type of cyclic group include groups in which one or more hydrogen atoms have been removed from a monocycloalkane or a polycycloalkane such as a bicycloalkane, tricycloalkane or tetracycloalkane, which may, or may not, be substituted with a fluorine atom or a fluoroalkyl group. Specific examples of suitable groups include groups in which one or more hydrogen atoms have been removed from a monocycloalkane such as cyclopentane or cyclohexane, or a polycycloalkane such as adamantane, norbornane, isobornane, tricyclodecane or tetracyclododecane. Of these, groups in which one or more hydrogen atoms have been removed from adamantane are particularly desirable.

Furthermore, in the above formula, $R^{21}$ and $R^{23}$ may each represent independent alkylene groups of 1 to 5 carbon atoms, wherein the terminal of $R^{23}$ and the terminal of $R^{21}$ are bonded together.

In such cases, a cyclic group is formed from the groups $R^{21}$ and $R^{23}$, the oxygen atom bonded to $R^{23}$, and the carbon atom that is bonded to this oxygen atom and the group $R^{21}$. This type of cyclic group is preferably a 4- to 7-membered ring, and 4- to 6-membered rings are even more desirable. Specific examples of these cyclic groups include a tetrahydropyranyl group and a tetrahydrofuranyl group.

In the general formula (a1-0-2), R is as defined above. $X^2$ is as defined for $X^1$ in the formula (a1-0-1).

$Y^2$ is a bivalent aliphatic cyclic group.

Because $Y^2$ is a bivalent aliphatic cyclic group, suitable groups include the same groups as those described in relation to the aforementioned "aliphatic cyclic groups", with the exception that two or more hydrogen atoms are removed from the cyclic structures.

More specific examples of the structural unit (a11) Include the structural units represented by general formulas (a1-1) to (a1-4) shown below.

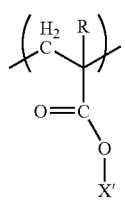

(a1-1)

-continued

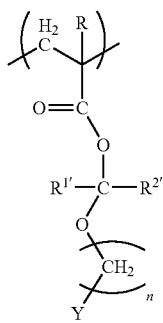
(a1-2)

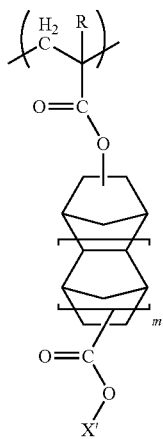
(a1-3)

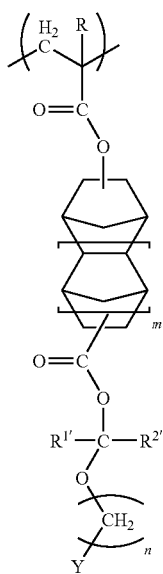
(a1-4)

[In the above formulas, X' represents a tertiary alkyl ester-based acid-dissociable, dissolution-inhibiting group, Y represents a lower alkyl group of 1 to 5 carbon atoms or an aliphatic cyclic group; n represents either 0 or an integer from 1 to 3; m represents either 0 or 1; R is as defined above, and $R^{1'}$ and $R^{2'}$ each represent, independently, a hydrogen atom or a lower alkyl group of 1 to 5 carbon atoms.]

At least one of the groups $R^{1'}$ and $R^{2'}$ is preferably a hydrogen atom, and those cases in which both groups are hydrogen atoms are particularly preferred. n is preferably either 0 or 1.

X' represents the same tertiary alkyl ester-based acid-dissociable, dissolution-inhibiting groups as those described above for $X^1$.

Examples of the aliphatic cyclic group represented by Y include the same groups as those exemplified above in the description relating to "aliphatic cyclic groups".

Specific examples of structural units represented by the above general formulas (a1-1) to (a1-4) are shown below.

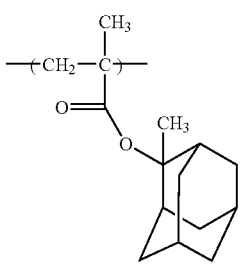
(a1-1-1)

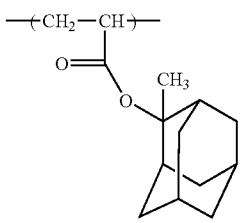
(a1-1-2)

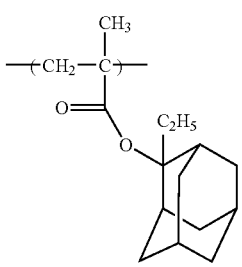
(a1-1-3)

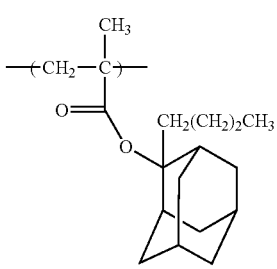
(a1-1-4)

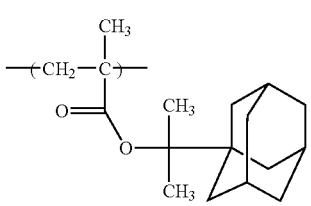
(a1-1-5)

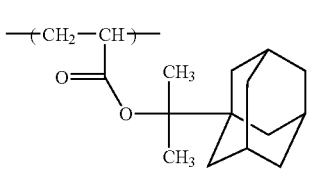
(a1-1-6)

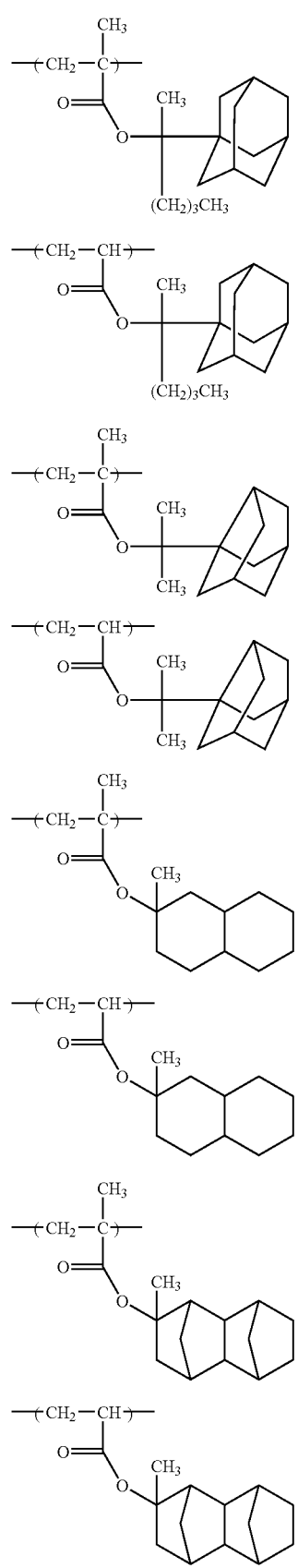
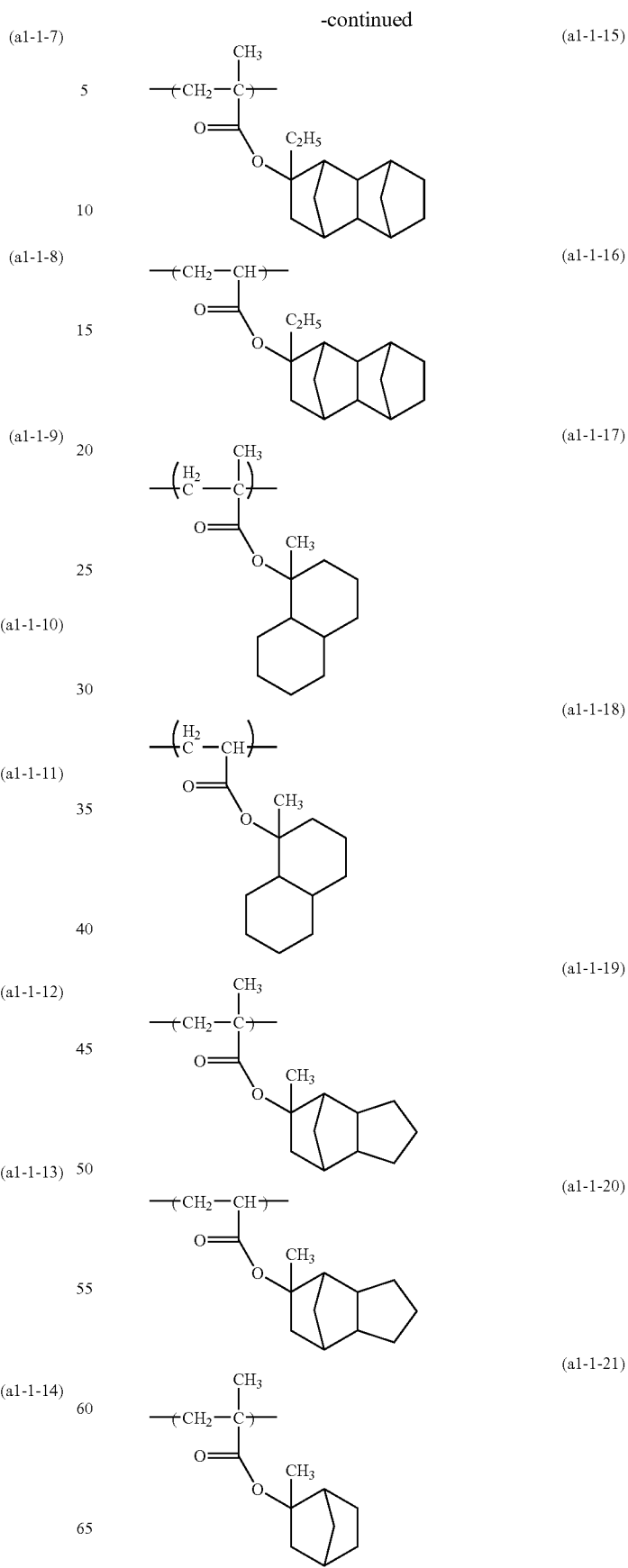

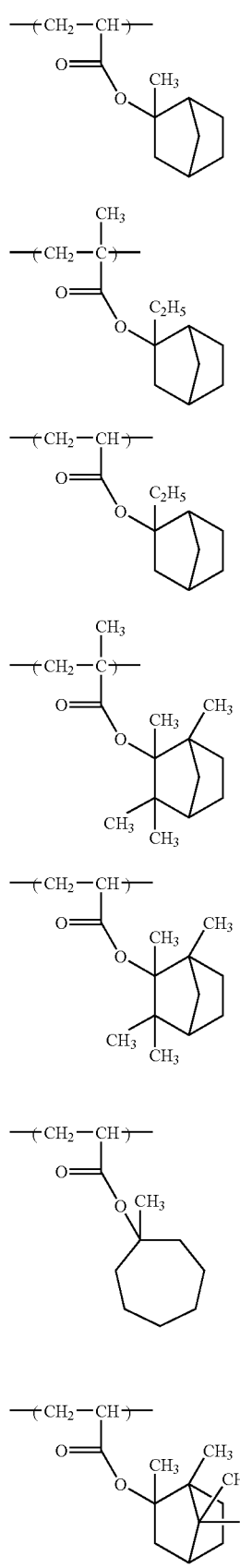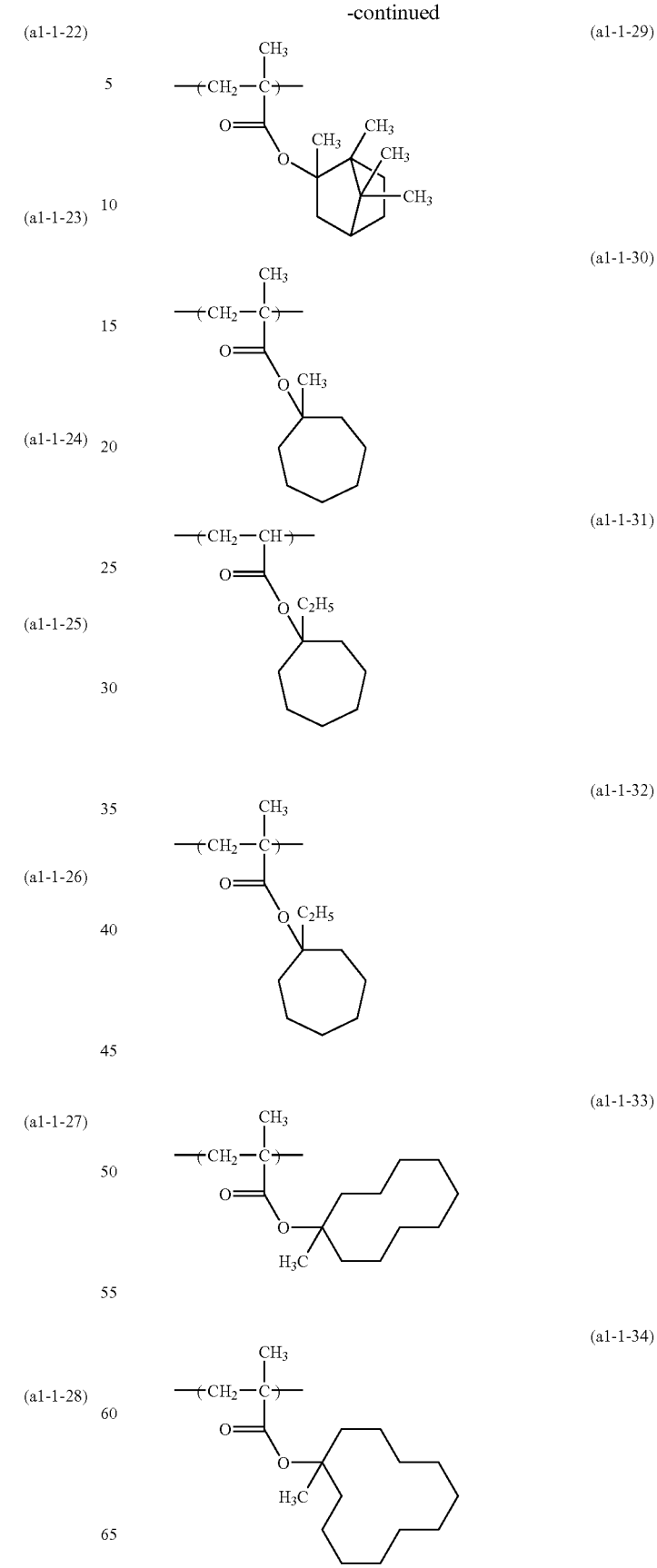

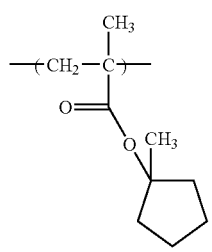 (a1-1-35)
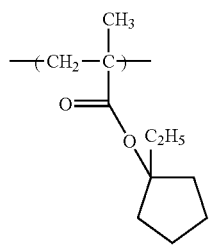 (a1-1-36)
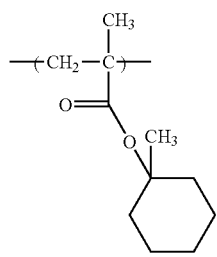 (a1-1-37)
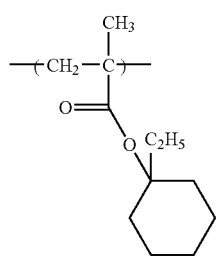 (a1-1-38)
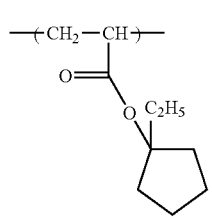 (a1-1-39)
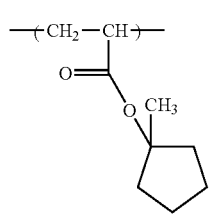 (a1-1-40)
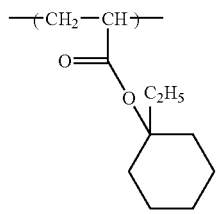 (a1-1-41)
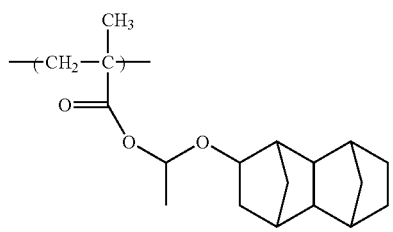 (a1-2-1)
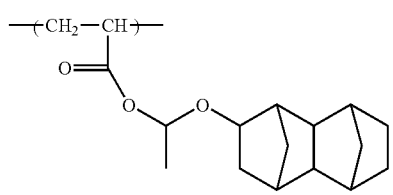 (a1-2-2)
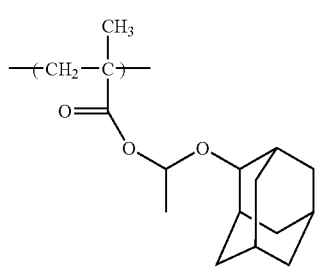 (a1-2-3)
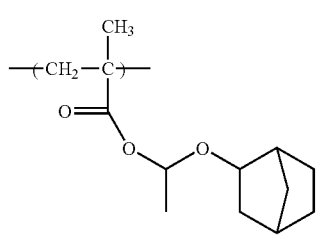 (a1-2-4)
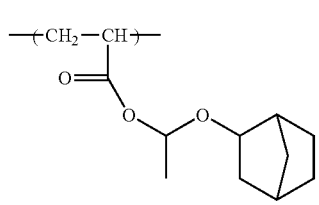 (a1-2-5)
(a1-2-6)

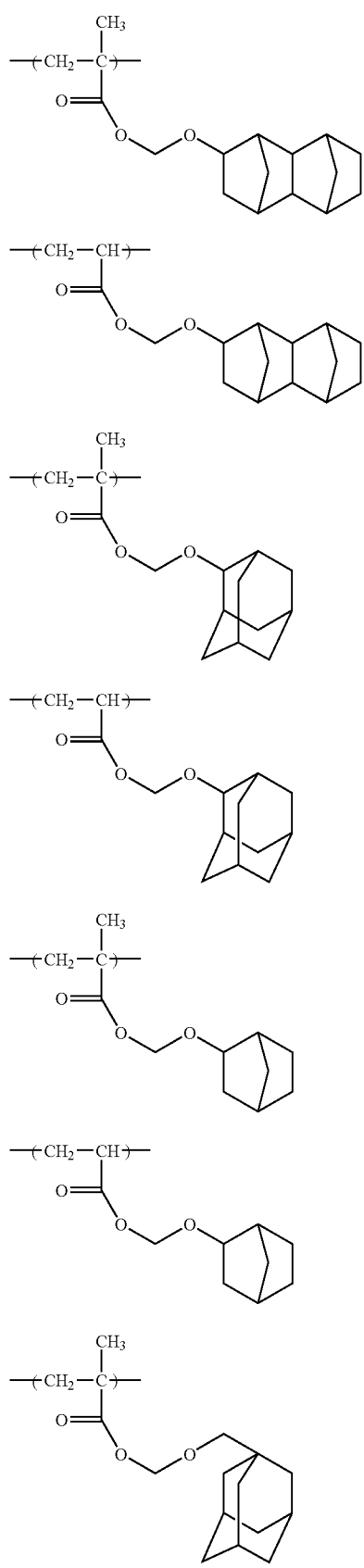
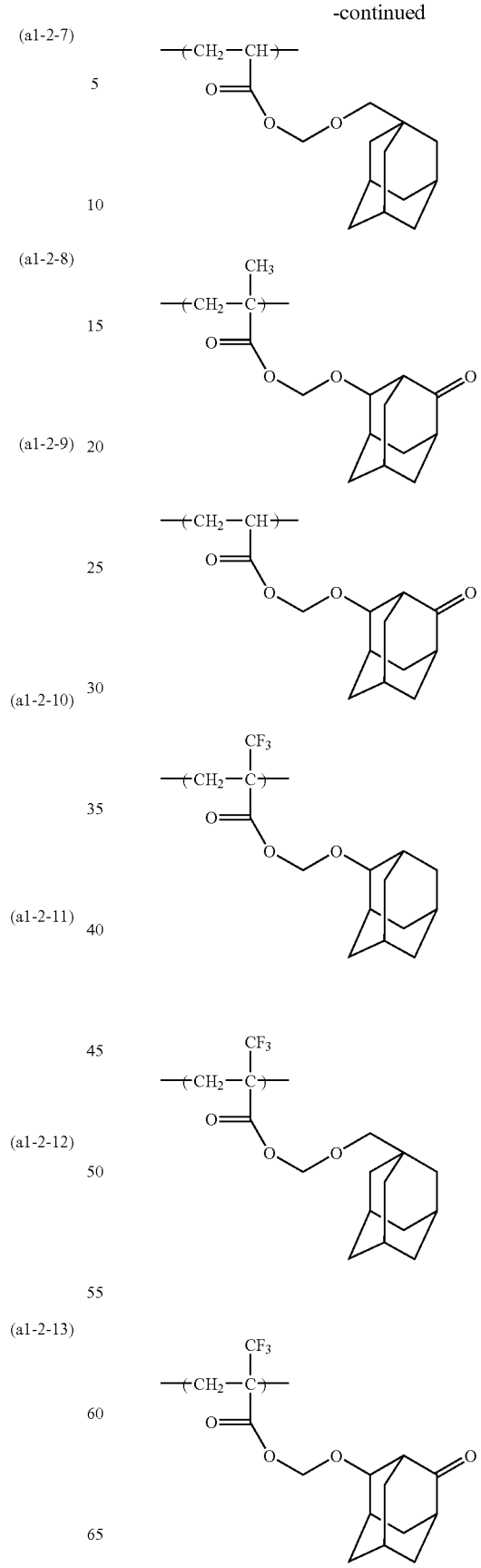

-continued
(a1-2-20)
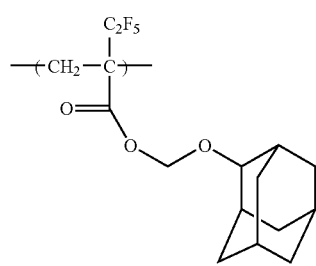
(a1-2-21)
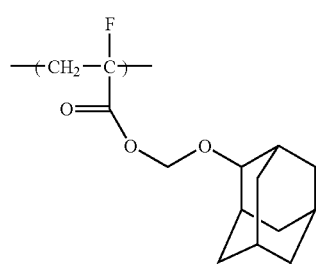
(a1-3-1)
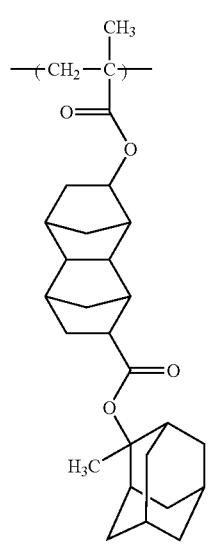
(a1-3-2)
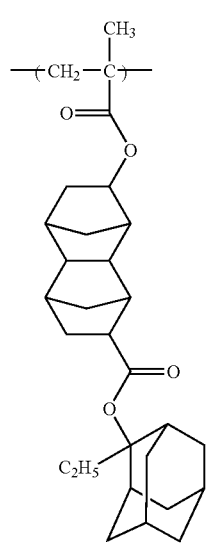
-continued
(a1-3-3)
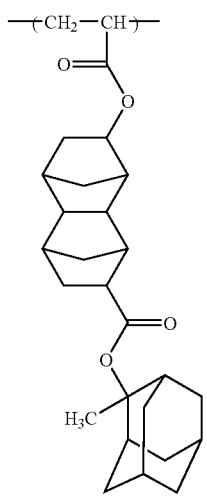
(a1-3-4)
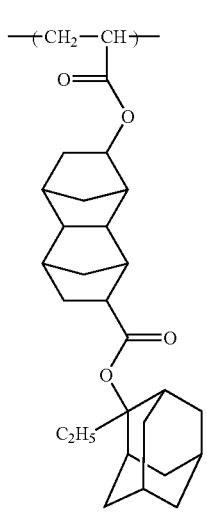
(a1-3-5)
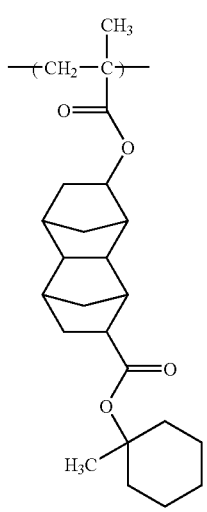

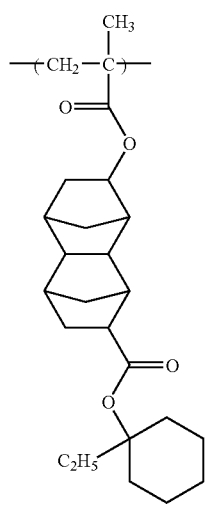
(a1-3-6)
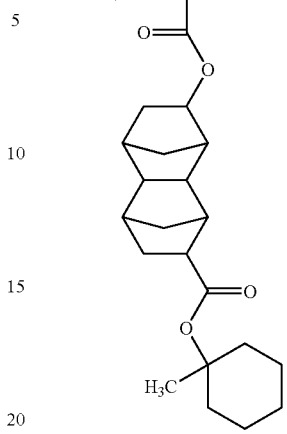
(a1-3-9)
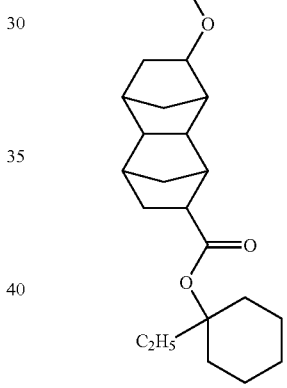
(a1-3-7)
(a1-3-10)
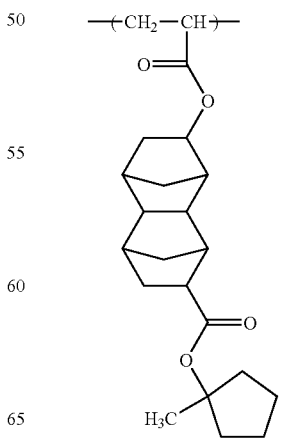
(a1-3-8)
(a1-3-11)

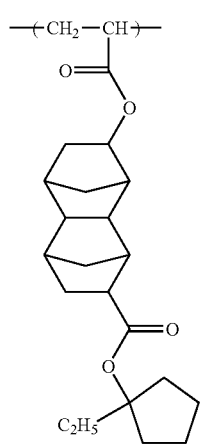 (a1-3-12)
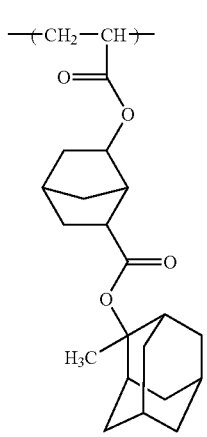 (a1-3-15)
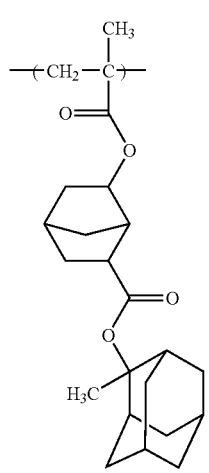 (a1-3-13)
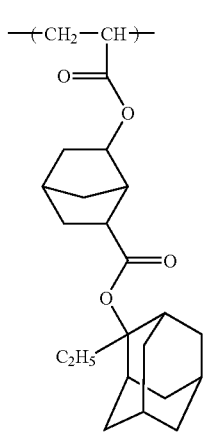 (a1-3-16)
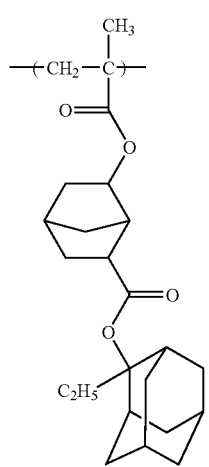 (a1-3-14)
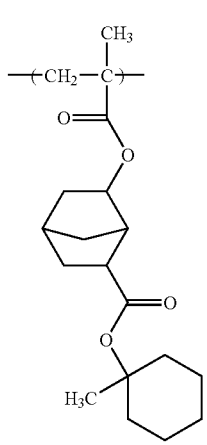 (a1-3-17)

-continued
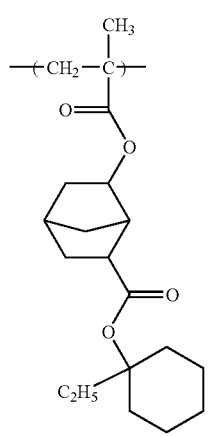
(a1-3-18)
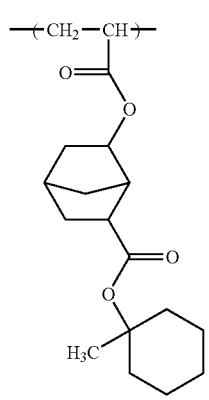
(a1-3-19)
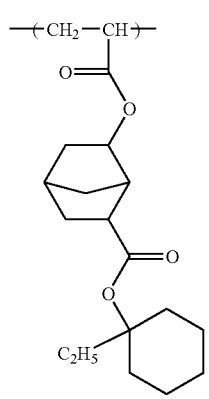
(a1-3-20)
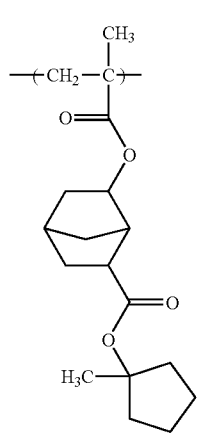
(a1-3-21)
-continued
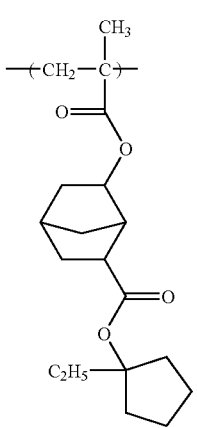
(a1-3-22)
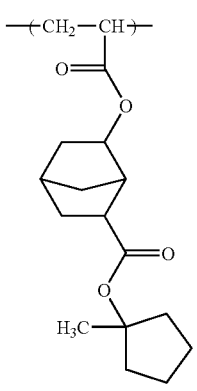
(a1-3-23)
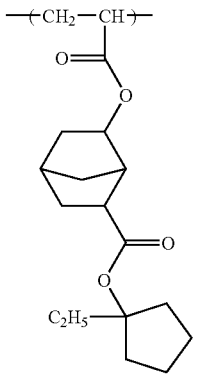
(a1-3-24)
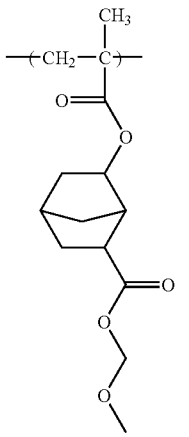
(a1-4-1)

-continued
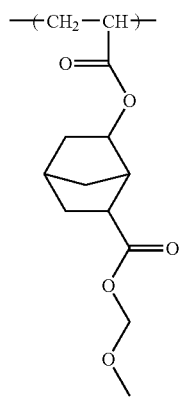
(a1-4-2)
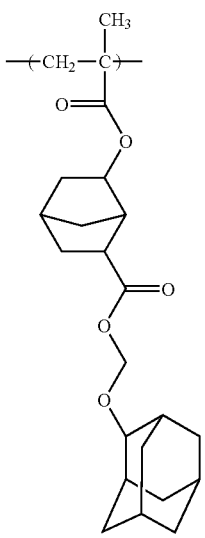
(a1-4-5)
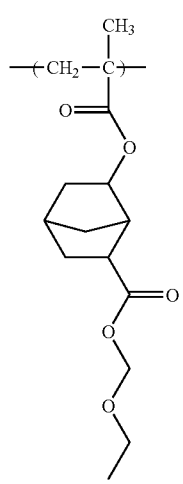
(a1-4-3)
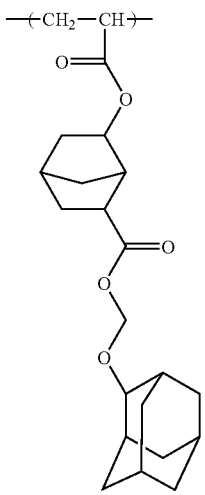
(a1-4-6)
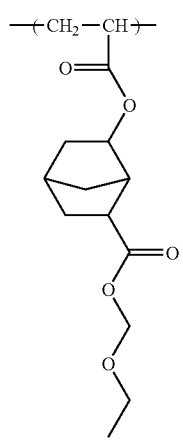
(a1-4-4)
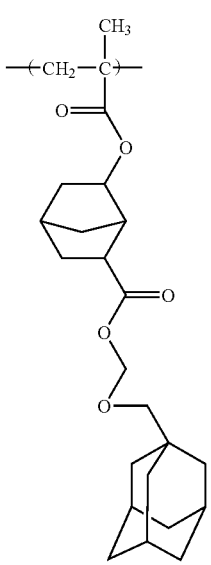
(a1-4-7)

(a1-4-8)
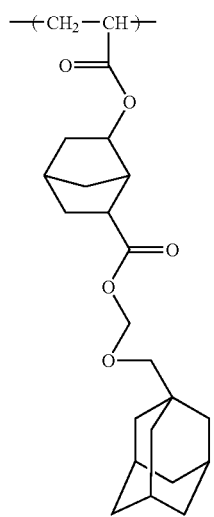
(a1-4-9)
(a1-4-10)
(a1-4-11)
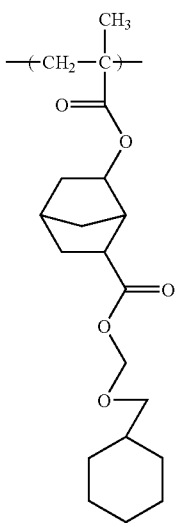
(a1-4-12)
(a1-4-13)
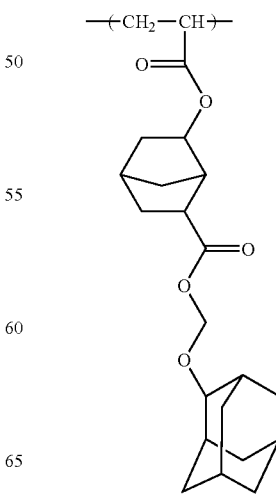

-continued
(a1-4-14)
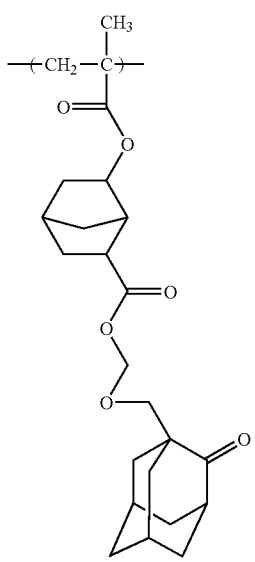
(a1-4-15)
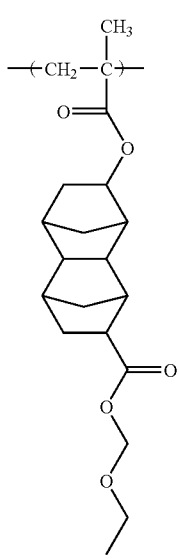
(a1-4-16)
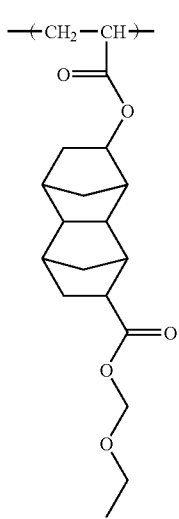
-continued
(a1-4-17)
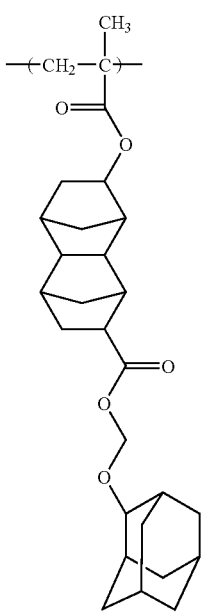
(a1-4-18)
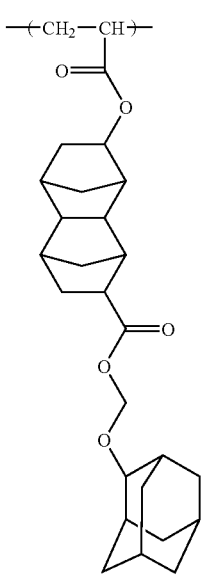

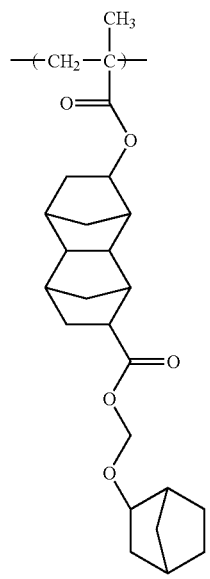
(a1-4-19)
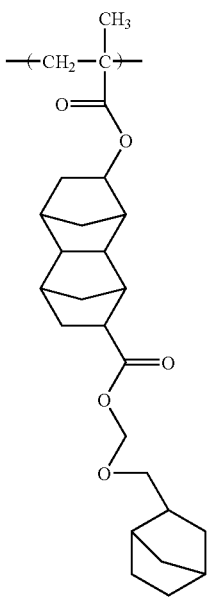
(a1-4-21)
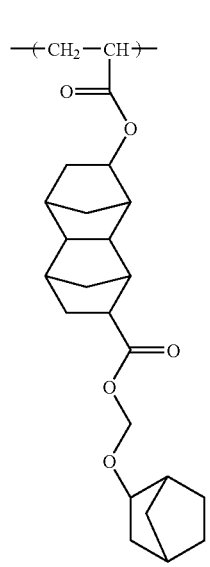
(a1-4-20)
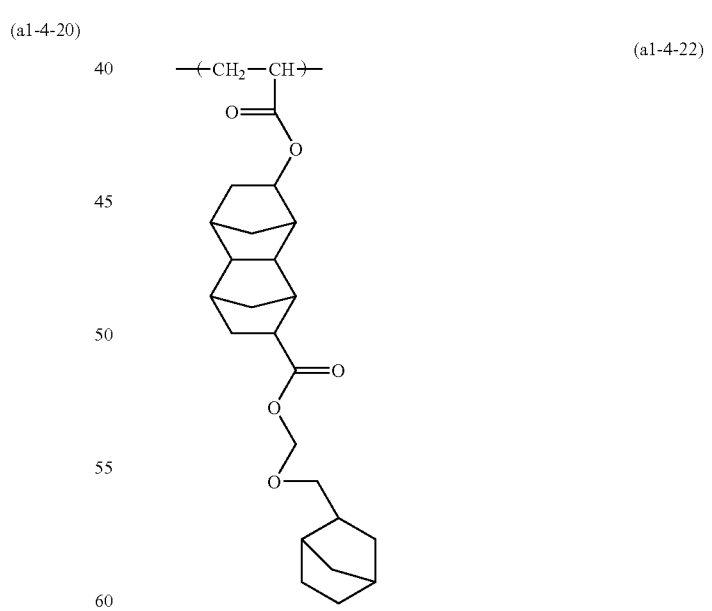
(a1-4-22)

(a1-4-23)
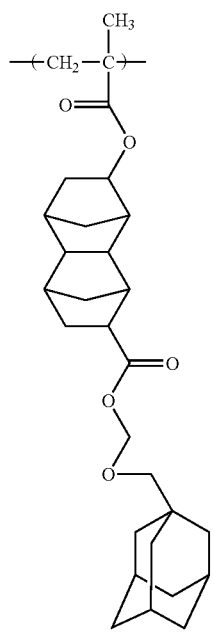
(a1-4-25)
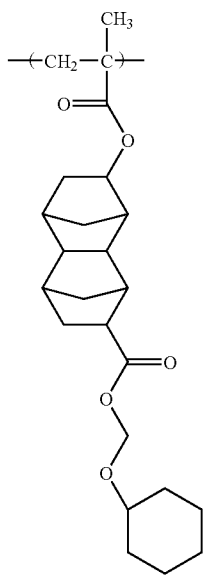
(a1-4-24)
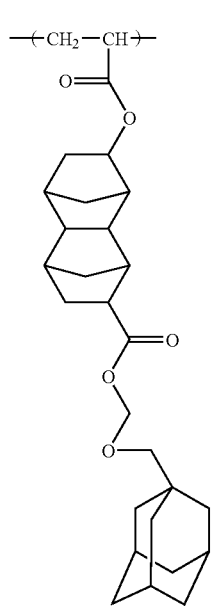
(a1-4-26)
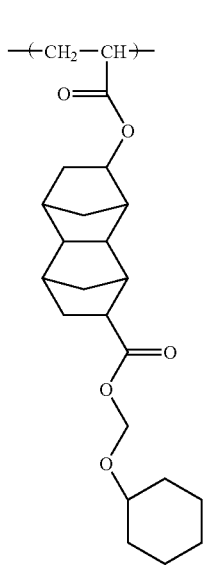

(a1-4-27)

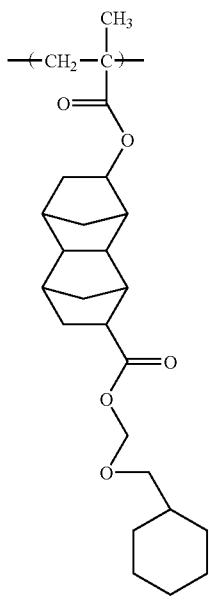

(a1-4-28)

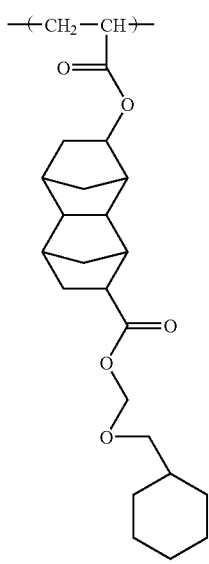

(a1-4-29)

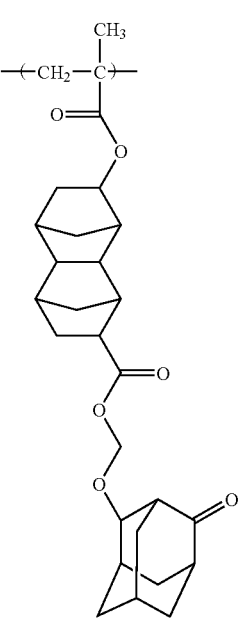

(a1-4-30)

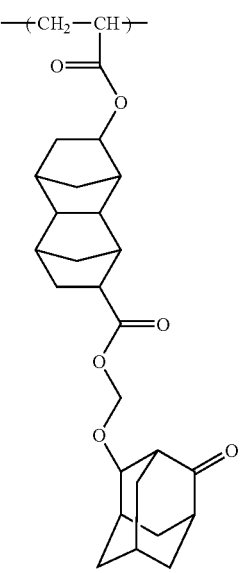

As the structural unit (a11), either a single type of structural unit may be used alone, or a combination of two or more different structural units may be used. Of the various possibilities, structural units represented by the general formula (a1-1) are preferred, and one or more units selected from amongst structural units represented by the formulas (a1-1-1) to (a1-1-6) and the formulas a1-1-35) to (a1-1-41) are the most desirable.

Moreover, as the structural unit (a11), units represented by a general formula (a1-1-01) shown below, which includes the structural units of the formulas (a1-1-1) through (a1-1-4), and units represented by a general formula (a1-1-02) shown below, which includes the structural units of the formulas (a1-1-36), (a1-1-38), (a1-1-39) and (a1-1-41) are particularly desirable.

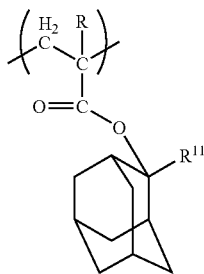

(a1-1-01)

(wherein, R represents a hydrogen atom or a lower alkyl group, and $R^{11}$ represents a lower alkyl group)

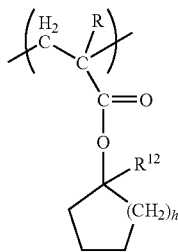

(a1-1-02)

(wherein, R represents a hydrogen atom or a lower alkyl group, $R^{12}$ represents a lower alkyl group, and h represents an integer from 1 to 3)

In the general formula (a1-1-01), R is as defined above. The lower alkyl group of $R^{11}$ is the same as the lower alkyl group defined for the group R, and is preferably a methyl group or ethyl group.

In the general formula (a1-1-02), R is as defined above. The lower alkyl group of $R^{12}$ is the same as the lower alkyl group defined for the group R, is preferably a methyl group or ethyl group, and is most preferably an ethyl group. h is preferably either 1 or 2, and is most preferably 2.

In the present invention, those cases in which the structural unit (a11) includes at least one unit selected from the group consisting of structural units represented by the above general formulas (a1-1-01) and (a1-1-03) yield particularly superior effects for the present invention, and are consequently preferred.

The proportion of the structural unit (a11) within the component (A), relative to the combined total of all the structural units that constitute the component (A), is preferably within a range from 10 to 80 mol %, even more preferably from 20 to 70 mol %, even more preferably from 25 to 50 mol %, and is most preferably from 30 to 40 mol %. Ensuring that this proportion is at least as large as the lower limit of the above range enables a more favorable pattern to be obtained when the component is used in a positive resist composition, whereas ensuring that the proportion is no greater than the upper limit enables a more favorable balance to be achieved with the other structural units.

—Structural Unit (a12)

As the structural unit (a1), the component (A) preferably also includes, besides the structural unit (a11), a structural unit (a12) derived from an (α-lower alkyl)acrylate ester that contains a lactone-containing monocyclic or polycyclic group.

When the component (A) is used in the formation of a resist film, the lactone-containing monocyclic or polycyclic group of the structural unit (a12) is effective in improving the adhesion between the resist film and the substrate, and enhancing the hydrophilicity of the component (A) relative to the developing solution.

In this description, the term "lactone-containing monocyclic or polycyclic group" refers to a cyclic group that contains a ring containing a —O—C(O)— structure (namely, a lactone ring). This lactone ring is counted as the first ring, and groups that contain only the lactone ring are referred to as monocyclic groups, whereas groups that also contain other ring structures are described as polycyclic groups regardless of the structure of the other rings.

As the structural unit (a12), any group can be used without any particular restrictions, provided it includes both the above type of lactone structure (—O—C(O)—) and a cyclic group.

In the present invention, cases where the structural unit (a12) is a structural unit derived from an (α-lower alkyl) acrylate ester that contains a lactone-containing monocyclic or polycyclic group in which the lactone ring is a 5-membered ring, such as the structural units represented by the general formulas (a2-1) to (a2-5) shown below, are particularly preferred as they yield superior effects for the present invention. These structural units can be represented by a general formula (2) shown below.

(2)

(wherein, R is as defined above, $A_1$ represents a single bond, or a bivalent or trivalent alicyclic hydrocarbon group containing a monocyclic or bridged cyclic structure of 5 to 12 carbon atoms, L represents a lactone structure represented by a general formula (3) shown below, and $A_1$ and L are bonded together via one or two linkage groups)

(3)

(wherein, either one or two of $R_{21}$ to $R_{24}$ represent linkage groups to $A_1$, and the remainder each represent either a hydrogen atom or a methyl group)

Specifically, examples of lactone-containing monocyclic groups include groups in which one hydrogen atom has been removed from a butyrolactone such as γ-butyrolactone. In the present invention, the structural unit (a12) is preferably at least one unit selected from the group consisting of structural units represented by a general formula (a2-1) shown below, as such structural units yield superior effects for the present invention.

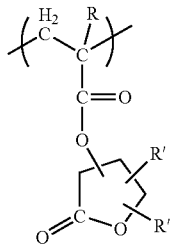
(a2-1)

(wherein, R represents a hydrogen atom or a lower alkyl group, and R' represents a hydrogen atom, a lower alkyl group, or an alkoxy group of 1 to 5 carbon atoms)

The lower alkyl groups represented by R and R' in the general formula (a2-1) are the same as the lower alkyl group represented by R in the structural unit (a11) described above.

In the general formula (a2-1), for reasons including industrial availability, R' is preferably a hydrogen atom.

More specific examples of the structural units represented by the general formula (a2-1) are shown below.

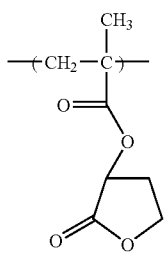
(a2-1-1)

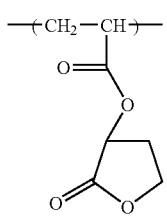
(a2-1-2)

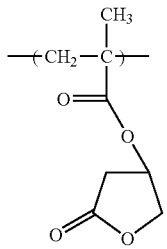
(a2-1-3)

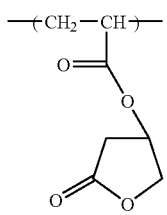
(a2-1-4)

-continued

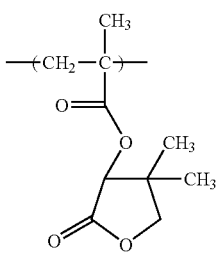
(a2-1-5)

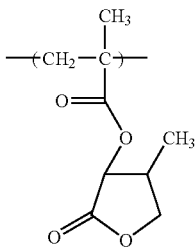
(a2-1-6)

In the present invention, as the structural unit (a12), of the structural units above, the use of a structural unit represented by the formula (a2-1-1) or (a2-1-2) is preferred.

Furthermore, examples of lactone-containing polycyclic groups include groups in which one hydrogen atom has been removed from a lactone ring-containing bicycloalkane, tricycloalkane, or tetracycloalkane. Groups obtained by removing one hydrogen atom from a lactone-containing tricycloalkane are particularly preferred in terms of factors such as industrial availability.

Specific examples of structural units derived from an (α-lower alkyl)acrylate ester that contains a lactone-containing polycyclic group include the structural units represented by general formulas (a2-2) to (a2-5) shown below.

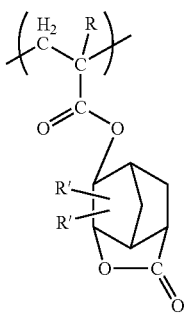
(a2-2)

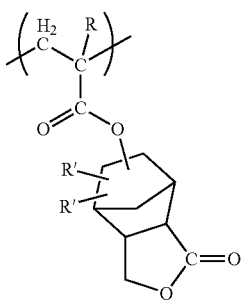
(a2-3)

-continued (a2-4)
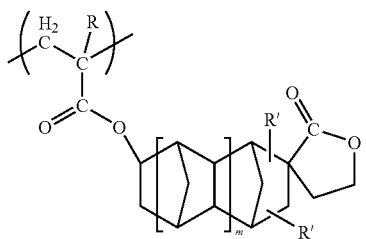

(a2-5)
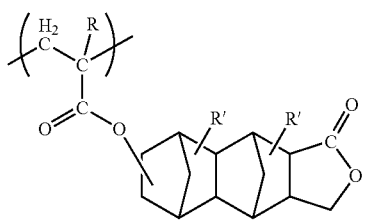

[wherein, R represents a hydrogen atom or a lower alkyl group, R' represents a hydrogen atom, a lower alkyl group, or an alkoxy group of 1 to 5 carbon atoms, and m represents an integer of 0 or 1]

The groups R and R' within the general formulas (a2-2) to (a2-5) are the same as the groups R and R' within the general formula (a2-1) described above.

Specific examples of structural units represented by the above general formulas (a2-2) to (a2-5) are shown below.

(a2-2-1)
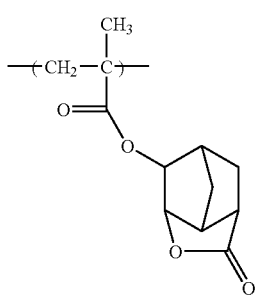

(a2-2-2)
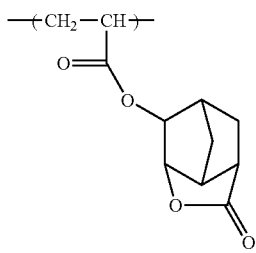

(a2-2-3)
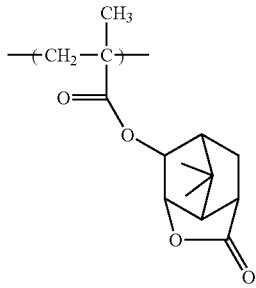

-continued (a2-2-4)
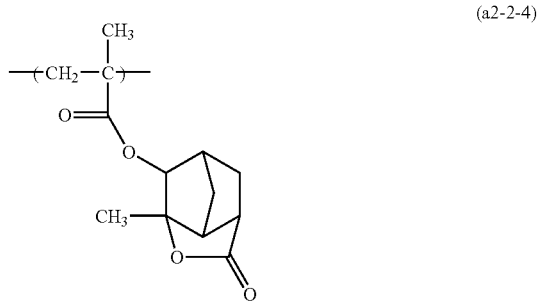

(a2-2-5)
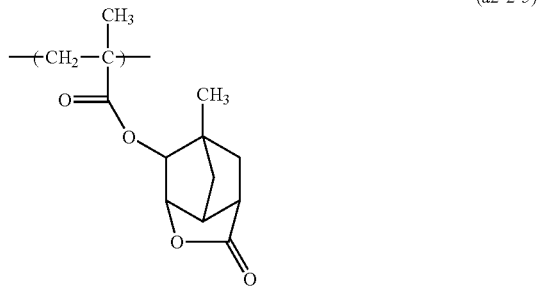

(a2-3-1)
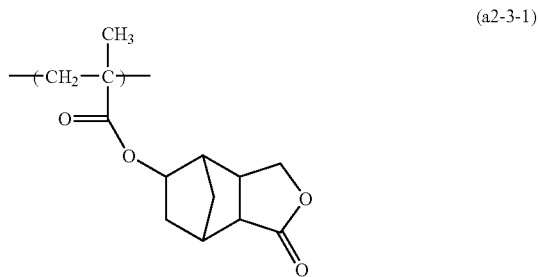

(a2-3-2)
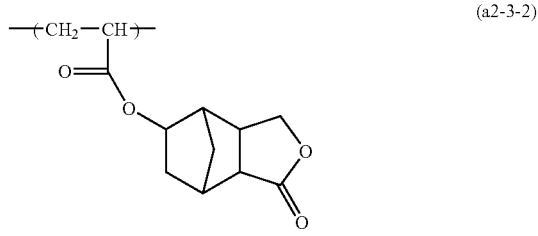

(a2-3-3)
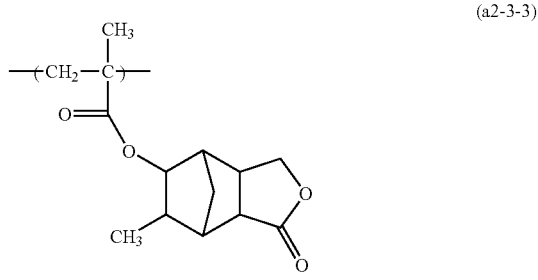

(a2-3-4)
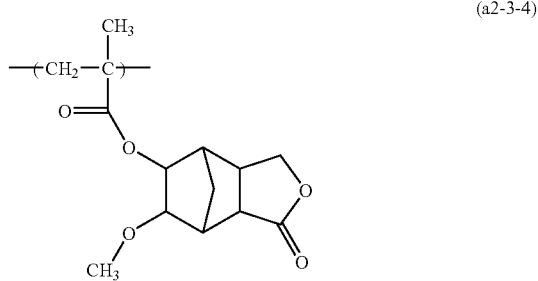

-continued
(a2-3-5)
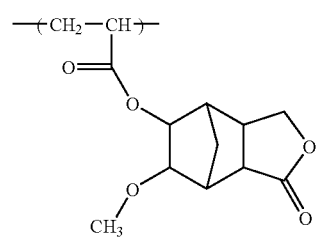
(a2-3-6)
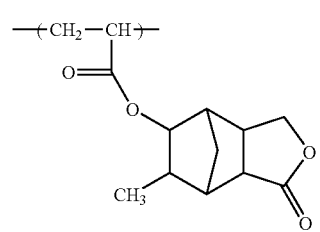
(a2-3-7)
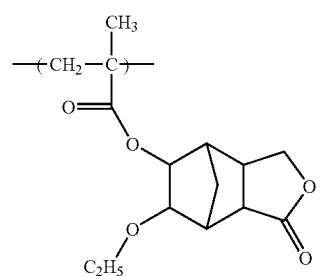
(a2-3-8)
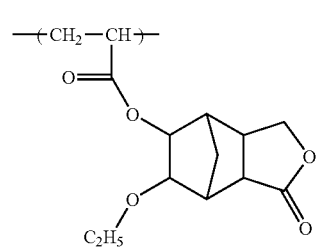
(a2-3-9)
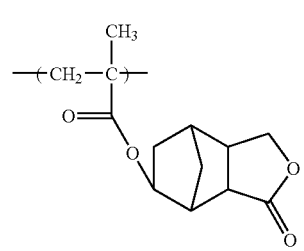
(a2-3-10)
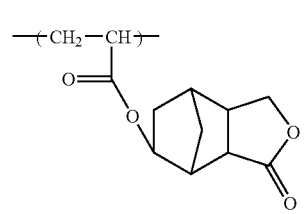
-continued
(a2-4-1)
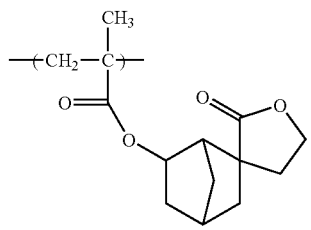
(a2-4-2)
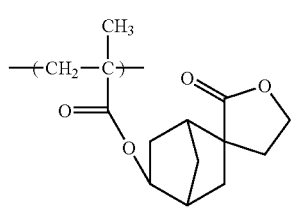
(a2-4-3)
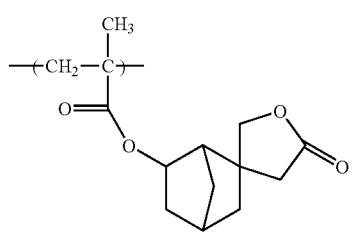
(a2-4-4)
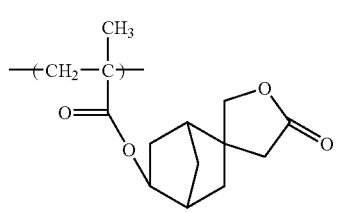
(a2-4-5)
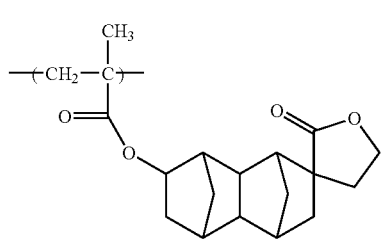
(a2-4-6)
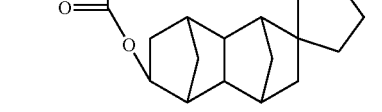
(a2-4-7)
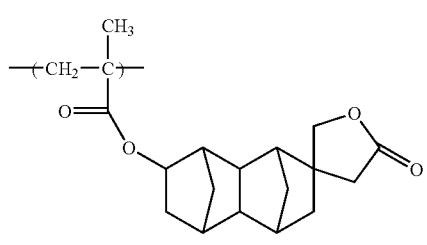

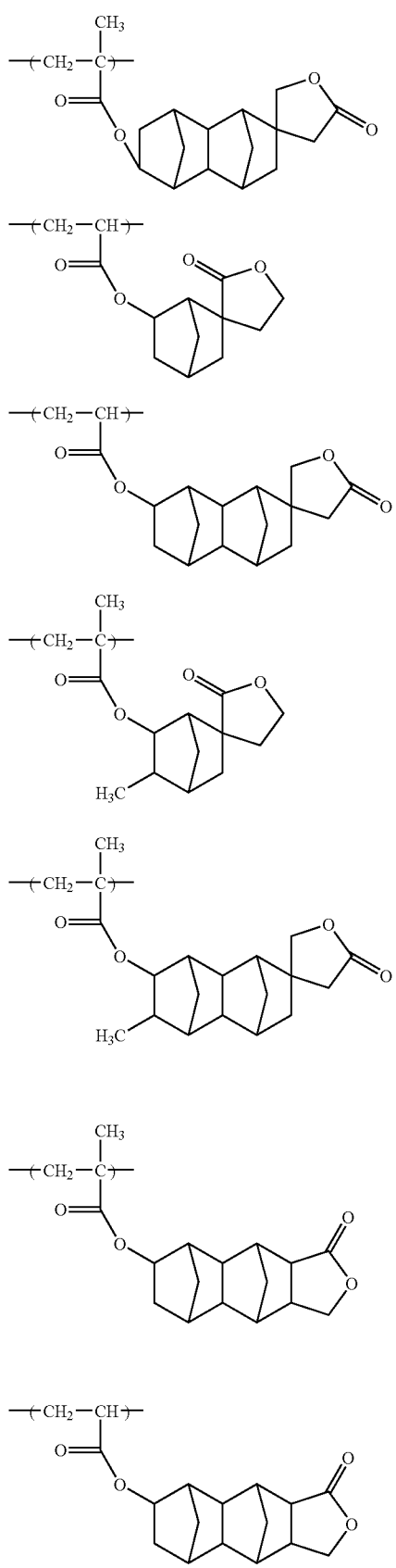

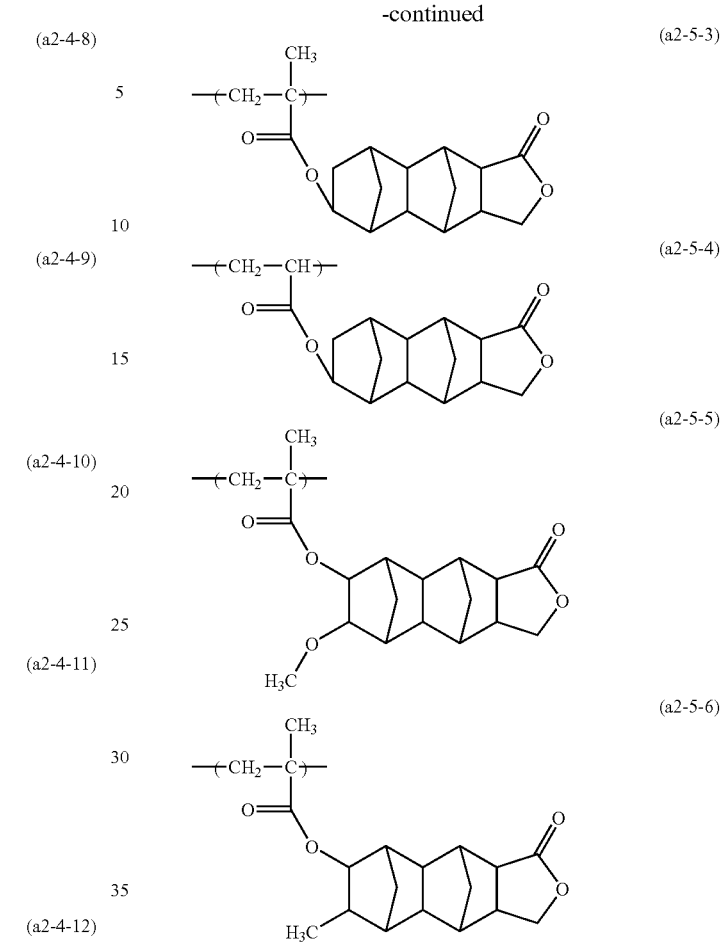

Of the above structural units, as the structural unit derived from an (α-lower alkyl)acrylate ester that contains a lactone-containing polycyclic group, the use of at least one structural unit selected from the group consisting of structural units represented by the general formulas (a2-2) and (a2-3) is preferred. Specifically, the use of at least one structural unit selected from amongst the formulas (a2-2-1), (a2-2-2), (a2-3-1), (a2-3-2), (a2-3-9), and (a2-3-10) is particularly preferred.

In the component (A), as the structural unit (a12), either a single type of structural unit may be used alone, or a combination of two or more different structural units may be used.

The proportion of the structural unit (a12) within the component (A), relative to the combined total of all the structural units that constitute the component (A), is preferably within a range from 5 to 60 mol %, even more preferably from 10 to 50 mol %, even more preferably from 20 to 50 mol %, and is most preferably from 30 to 45 mol %. Ensuring that this proportion is at least as large as the lower limit of the above range ensures that the effects obtained by including the structural unit (a12) manifest satisfactorily, whereas ensuring that the proportion is no greater than the upper limit enables a more favorable balance to be achieved with the other structural units.

—Structural Unit (a13)

As the structural unit (a1), the component (A) preferably also includes, in addition to the structural unit (a11), or in addition to the combination of the structural units (a11) and (a12), a structural unit (a13) derived from an (α-lower alkyl) acrylate ester that contains a polar group-containing aliphatic hydrocarbon group. Including the structural unit (a13) enhances the hydrophilicity of the component (A), thereby improving the affinity with the developing solution, improving the alkali solubility within the exposed portions of the resist, and contributing to an improvement in the resolution.

Examples of the polar group include a hydroxyl group, cyano group, carboxyl group, or hydroxyalkyl group in which a portion of the hydrogen atoms of the alkyl group have been substituted with fluorine atoms or the like, although a hydroxyl group is particularly preferred.

Examples of the aliphatic hydrocarbon group include straight-chain or branched hydrocarbon groups (and preferably alkylene groups) of 1 to 10 carbon atoms, and alicyclic hydrocarbon groups of 6 to 12 carbon atoms. These alicyclic hydrocarbon groups are preferably polycyclic aliphatic hydrocarbon groups (polycyclic groups), and these polycyclic groups can be selected appropriately from the multitude of groups that have been proposed for the resins of resist compositions designed for use with ArF excimer lasers.

Examples of structural units derived from an (α-lower alkyl)acrylate ester that contains a hydroxyl group-containing aliphatic hydrocarbon group include the structural units derived from an (α-lower alkyl)acrylate ester represented by a general formula (11) shown below.

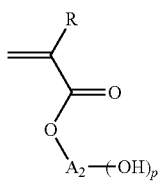

(11)

(wherein, R is as defined above, $A_2$ represents a bivalent or trivalent alicyclic hydrocarbon group containing a monocyclic or bridged cyclic structure of 6 to 12 carbon atoms, and p represents an integer from 1 to 2)

As the structural unit (a13), of the various possibilities, structural units that include an aliphatic polycyclic group that contains a hydroxyl group, cyano group, carboxyl group or a hydroxyalkyl group in which a portion of the hydrogen atoms of the alkyl group have been substituted with fluorine atoms, and are also derived from an (α-lower alkyl)acrylate ester are particularly preferred. Examples of suitable polycyclic groups include groups in which one or more hydrogen atoms have been removed from a bicycloalkane, tricycloalkane or tetracycloalkane or the like. Specific examples include groups in which one or more hydrogen atoms have been removed from a polycycloalkane such as adamantane, norbornane, isobornane, tricyclodecane or tetracyclododecane. These types of polycyclic groups can be selected appropriately from the multitude of groups proposed for the polymer (resin component) of resist compositions designed for use with ArF excimer lasers. Of these polycyclic groups, groups in which two or more hydrogen atoms have been removed from adamantane, groups in which two or more hydrogen atoms have been removed from norbornane, and groups in which two or more hydrogen atoms have been removed from tetracyclododecane are preferred industrially.

When the hydrocarbon group within the polar group-containing aliphatic hydrocarbon group is a straight-chain or branched hydrocarbon group of 1 to 10 carbon atoms, the structural unit (a13) is preferably a structural unit derived from the hydroxyethyl ester of the (α-lower alkyl)acrylic acid, whereas when the hydrocarbon group is a polycyclic group, examples of preferred structural units include the structural units represented by a formula (a3-1), the structural units represented by a formula (a3-2), and the structural units represented by a formula (a3-3), all of which are shown below.

In the present invention, the structural unit (a13) is preferably one or more units selected from the group consisting of structural units represented by the formula (a3-1) shown below, as such structural units yield superior effects for the present invention.

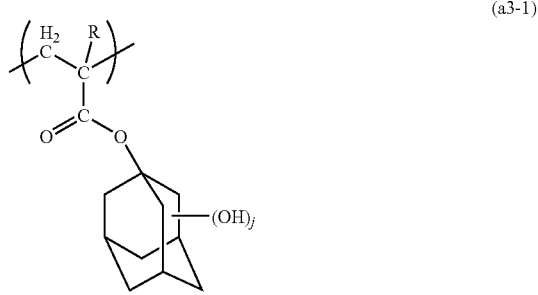

(a3-1)

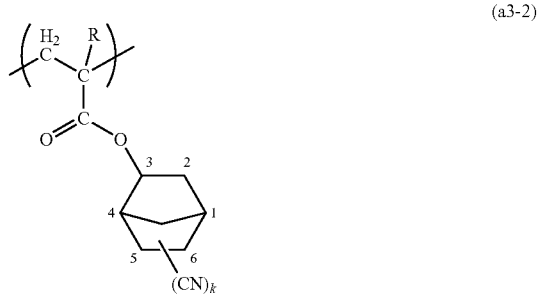

(a3-2)

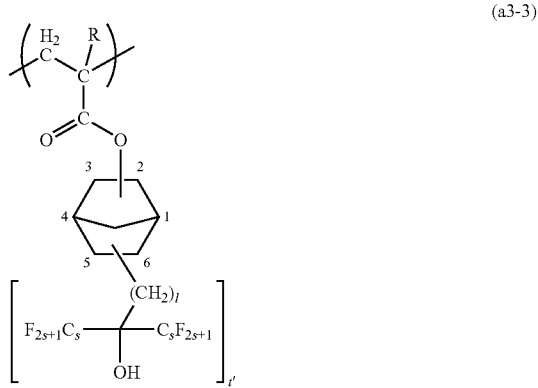

(a3-3)

(wherein, R is as defined above, j represents an integer from 1 to 3, k represents an integer from 1 to 3, t' represents an integer from 1 to 3, l represents an integer from 1 to 5, and s represents an integer from 1 to 3)

In the formula (a3-1), the value of j is preferably either 1 or 2, and is most preferably 1. In those cases where j is 2, the hydroxyl groups are preferably bonded to position 3 and position 5 of the adamantyl group. In those cases where j is 1, the hydroxyl group is preferably bonded to position 3 of the adamantyl group.

In the formula (a3-2), the value of k is preferably 1. The cyano group is preferably bonded to either position 5 or position 6 of the norbornyl group.

In the formula (a3-3), the value of t' is preferably 1. The value of l is also preferably 1. The value of s is also preferably 1. In these units, a 2-norbornyl group or 3-norbornyl group is preferably bonded to the carboxyl group terminal of the (α-lower alkyl)acrylic acid. A fluorinated alkyl alcohol is preferably bonded to either position 5 or 6 of the norbornyl group.

As the structural unit (a13), either a single type of structural unit may be used alone, or a combination of two or more different structural units may be used.

In those cases where the component (A) includes a structural unit (a13), the proportion of the structural unit (a13) within the component (A), relative to the combined total of all the structural units that constitute the component (A), is preferably within a range from 5 to 50 mol %, even more preferably from 15 to 45 mol %, even more preferably from 15 to 35 mol %, and is most preferably from 15 to 25 mol %.

—Structural Unit (a14)

As the structural unit (a1), the component (A) may also include other structural units (a14) besides the structural units (a11) to (a13) described above, provided the inclusion of these other units does not impair the effects of the present invention.

As the structural unit (a14), any other structural unit that cannot be classified as one of the above structural units (a11) through (a13) can be used without any particular restrictions, and any of the multitude of conventional structural units used within resist resins for ArF excimer lasers or KrF excimer lasers (and particularly for ArF excimer lasers) can be used.

As the structural unit (a14), structural units that contain a non-acid-dissociable aliphatic polycyclic group, and are also derived from an (α-lower alkyl)acrylate ester are preferred. Examples of the polycyclic group include the same groups as those described above in relation to the structural unit (a11), and any of the multitude of conventional polycyclic groups used within the resin component of resist compositions for ArF excimer lasers or KrF excimer lasers (and particularly for ArF excimer lasers) can be used.

In particular, at least one group selected from amongst a tricyclodecanyl group, adamantyl group, tetracyclododecanyl group, isobornyl group, and norbornyl group is preferred in terms of factors such as industrial availability. The hydrogen atoms of these polycyclic groups may be substituted with straight-chain or branched alkyl groups of 1 to 5 carbon atoms.

Specific examples of the structural unit (a14) include units with structures represented by general formulas (a4-1) to (a4-5) shown below.

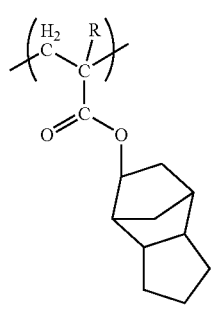

(a4-1)

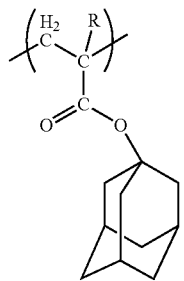

(a4-2)

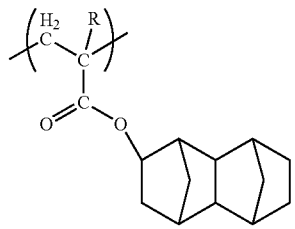

(a4-3)

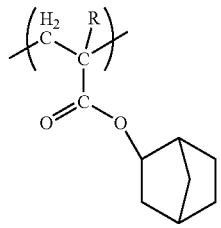

(a4-4)

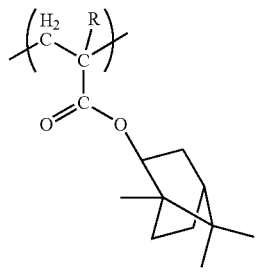

(a4-5)

(wherein, R is as defined above)

Although the structural unit (a14) is not an essential component within the component (A), if included within the component (A), the proportion of the structural unit (a14), relative to the combined total of all the structural units that constitute the component (A), is typically within a range from 1 to 30 mol %, and is preferably from 5 to 20 mol %.

In the present invention, the component (A) is preferably a copolymer (hereafter referred to as the copolymer (A1)) containing all of the aforementioned structural units (a11), (a12) and (a2), as such copolymers exhibit superior effects for the present invention.

As the copolymer (A1), copolymers containing a structural unit represented by the above general formula (1) as the structural unit (a11), a structural unit represented by the above general formula (2) as the structural unit (a12), and a structural unit represented by the above general formula (4) as the structural unit (a2) are particularly preferred.

The composition of the copolymer (A1) preferably includes from 10 to 60 mol % of the structural unit (a11), from 5 to 60 mol % of the structural unit (a12), from 0 to 40 mol % of the structural unit (a13) and from 1 to 30 mol % of the structural unit (a2), and most preferably includes from 20 to 50 mol % of the structural unit (a11), from 20 to 60 mol % of the structural unit (a12), from 5 to 35 mol % of the structural unit (a13) and from 2 to 20 mol % of the structural unit (a2).

In the present invention, the component (A) is preferably either a ternary copolymer containing the structural units (a11), (a12) and (a2), or a quaternary copolymer containing the structural units (a11), (a12), (a13) and (a2).

Although there are no particular restrictions on the weight average molecular weight (Mw) (the polystyrene equivalent value determined by gel permeation chromatography (GPC)) of the component (A), the weight average molecular weight is preferably within a range from 2,000 to 40,000, even more preferably from 3,000 to 30,000, and is most preferably from 4,000 to 25,000. Provided the weight average molecular weight is lower than the upper limit of this range, the level of solubility within resist solvents is adequate for use within a resist, whereas values larger than the lower limit of the above range ensure that favorable levels of dry etching resistance and resist pattern cross-sectional shape can be obtained.

Furthermore, the degree of dispersion (Mw/Mn) is preferably within a range from 1.0 to 5.0, even more preferably from 1.0 to 3.0, and is most preferably from 1.2 to 2.5.

With the exception of the presence of acid during the production, the component (A) can be obtained by conventional production methods used for producing polymers, and can be produced, for example, by a conventional polymerization method such as a radical polymerization. During this production, the addition of acid may be conducted at the same time that the monomers are undergoing polymerization, or may be conducted following completion of the polymerization reaction.

In the present invention, the use of a solution polymerization method in which at least one monomer and a polymerization initiator are dissolved in a solvent, and the monomer is then subjected to a radical polymerization at a predetermined polymerization temperature is particularly preferred.

Furthermore, a chain transfer agent such as $HS-CH_2-CH_2-CH_2-C(CF_3)_2-OH$ may also be introduced during the above polymerization. This enables $-C(CF_3)_2-OH$ groups to be introduced at the terminals of the copolymer (A). A copolymer wherein hydroxyalkyl groups, in which a portion of the hydrogen atoms of the alkyl group have been substituted with fluorine atoms, have been introduced in this manner is effective in reducing the levels of developing defects and LER (line edge roughness: non-uniform irregularities within the line side walls).

As the polymerization initiator, any of those compounds typically used as radical generators can be used without any particular restrictions, and specific examples include azo compounds such as 2,2'-azobisisobutyronitrile, 2,2'-azobis (2-methylbutyronitrile), 2,2'-azobisdimethylisobutyrate, 1,1'-azobis(cyclohexane-1-carbonitrile), and 4,4'-azobis(4-cyanovaleric acid); and organic peroxides such as decanoyl peroxide, lauroyl peroxide, benzoyl peroxide, bis(3,5,5-trimethylhexanoyl) peroxide, succinic acid peroxide, tert-butylperoxy-2-ethylhexanoate, tert-butylperoxypivalate, and 1,1,3,3-tetramethylbutylperoxy-2-ethylhexanoate, which may be used either alone or in mixtures.

The quantity used of the polymerization initiator can be selected in accordance with factors such as the desired Mw, the nature of the monomer(s), polymerization initiator, chain transfer agent and solvent, the composition, the polymerization temperature, and the rate of dropwise addition.

Examples of suitable chain transfer agents include conventional thiol compounds such as dodecanethiol, mercaptoethanol, mercaptopropanol, mercaptoacetic acid and mercaptopropionic acid, which may be used either alone or in mixtures.

The quantity used of the chain transfer agent can be selected in accordance with factors such as the desired Mw, the nature of the monomer(s), polymerization initiator, chain transfer agent and solvent, the composition, the polymerization temperature, and the rate of dropwise addition.

The polymerization solvent is preferably a solvent capable of dissolving the monomer(s), polymerization initiator and chain transfer agent, as well as the copolymer produced by the polymerization. Examples of suitable solvents include ketones such as acetone, methyl ethyl ketone, methyl amyl ketone, and cyclohexanone; ethers such as tetrahydrofuran, dioxane, glyme, and propylene glycol monomethyl ether; esters such as ethyl acetate and ethyl lactate; ether esters such as propylene glycol methyl ether acetate; and lactones such as γ-butyrolactone, and these solvents may be used either alone or in mixtures.

The acid used in the production of the component (A) is defined as having no polymerizability relative to the monomer(s) used in the production of the copolymer, and being capable of dissociating at least a portion of the ester terminal portions of the (α-lower alkyl)acrylate ester (namely, the group X within the above general formula (a-1), such as the acid-dissociable, dissolution-inhibiting group within the structural unit (a11)).

In the present invention, the use of a strong acid with a pKa value in water at 25° C. of not more than 2.0 is preferred. Strong acids with a pKa value of 1.0 or less are even more preferred, and pKa values of 0.5 or less are particularly desirable. Specific examples of these types of strong acid include perfluorocarboxylic acids such as trifluoroacetic acid, organic sulfonic acids such as trifluoromethanesulfonic acid, methanesulfonic acid, p-toluenesulfonic acid and the hydrate thereof, and benzenesulfonic acid and the hydrate thereof, as well as sulfuric acid, hydrochloric acid, nitric acid, perchloric acid and hydrobromic acid, and mixtures of two or more of these strong acids may also be used. Of these acids, sulfuric acid is preferred as it yields superior effects for the present invention.

There are no particular restrictions on the method used for adding the acid, and the quantity of acid added during polymerization of the monomers can be set appropriately in accordance with factors such as the desired proportion of the structural unit (a2), the structure of the ester terminal portion of the (α-lower alkyl)acrylate ester, and the nature of the acid being used.

For example, in those cases where the monomer(s) are dissolved in the solvent together with the polymerization initiator, and polymerization of the monomer(s) is then conducted within solution, the concentration of acid within the solution is preferably within a range from 0.1 to 1,000 ppm, even more preferably from 1 to 500 ppm, even more preferably from 5 to 300 ppm, and is most preferably from 5 to 50 ppm.

A description of a preferred embodiment of a method of producing the component (A) is provided below.

In this embodiment, the component (A) is obtained via a step (P) described below, and at least one of a step (Q-1) and a step (Q-2) (hereafter, the step (Q-1) and the step (Q-2) may be referred to jointly as the step (Q)).

Step (P): a step of polymerizing a monomer that includes at least one (α-lower alkyl)acrylate ester, thereby yielding a polymer containing at least one structural unit (a1) derived from an (α-lower alkyl)acrylate ester.

Step (Q-1): a step of producing an (α-lower alkyl)acrylic acid by dissociating the ester terminal portion of an (α-lower alkyl) acrylate ester under the action of an acid.

Step (Q-2): a step of producing a structural unit (a2) derived from an (α-lower alkyl)acrylic acid by dissociating the ester terminal portion of a structural unit (a1) derived from an (α-lower alkyl)acrylate ester under the action of an acid.

The step (P) can be executed by conducting a radical polymerization within a polymerization solvent (a solution polymerization), and the method for this step can be selected from conventional methods without any particular restrictions. Examples of suitable methods include: (1) so-called batch methods in which the monomer and the polymerization initiator are dissolved in a solvent, and the solution is then heated to effect the polymerization, (2) dropwise methods in which the monomer and the polymerization initiator, in solution within a solvent where necessary, are added dropwise to a heated solvent to effect the polymerization, (3) so-called independent dropwise methods in which the monomer and the polymerization initiator are added separately, in solution within a solvent where necessary, in a dropwise manner to a heated solvent to effect the polymerization, and (4) initiator dropwise methods in which the monomer is dissolved in a solvent and heated, and a separate solution prepared by dissolving the polymerization initiator in a solvent is then added dropwise to the monomer solution to effect the polymerization. Of these, independent dropwise methods (3) are particularly desirable.

In the step (P), as described above, a chain transfer agent may be used.

Furthermore, in the dropwise methods of (2) to (4), this chain transfer agent may be mixed with the monomer and added dropwise, mixed with the polymerization initiator and added dropwise, or dissolved within a preheated solvent.

Furthermore, in the dropwise methods, the time required for the dropwise addition, the composition of the monomer that undergoes dropwise addition, and the relative proportions of the monomer, the polymerization initiator and the chain transfer agent may be altered as required.

The polymerization temperature can be selected in accordance with factors such as the boiling points of the solvent, the monomer and the chain transfer agent and the like, and the half-life temperature of the polymerization initiator. At low temperatures, the polymerization tends to proceed poorly, which creates productivity problems, whereas if the temperature is raised higher than is necessary, then problems of stability may arise for the monomer and the product polymer Accordingly, the polymerization temperature is preferably within a range from 40 to 120° C., and is even more preferably from 60 to 100° C.

If the dropwise addition time used in the dropwise methods is too short, then the molecular weight distribution tends to broaden, and because a larger quantity of solution is added within a short time, an unfavorable reduction in the temperature of the polymerization solution may occur, whereas if the dropwise addition time is too long, then an unnecessarily high degree of heat history is imparted to the copolymer, and the productivity also deteriorates. Accordingly, the dropwise addition time is typically within a range from 30 minutes to 24 hours, preferably from 1 to 12 hours, and is even more preferably from 2 to 8 hours.

Following completion of the dropwise addition in a dropwise method, or following raising of the polymerization temperature in a batch method, aging is preferably conducted either by holding the temperature for a predetermined period or by raising the temperature, thereby reacting any residual unreacted monomer. If this aging time is too long, then the production efficiency per unit of time deteriorates, and an unnecessarily high degree of heat history is imparted to the copolymer. As a result, the aging time is typically no more than 12 hours, preferably no more than 6 hours, and is most preferably within a range from 1 to 4 hours.

In the step (P), two or more monomers including at least an (α-lower alkyl)acrylate ester containing an acid-dissociable, dissolution-inhibiting group, and an (α-lower alkyl)acrylate ester that contains a lactone-containing monocyclic or polycyclic group are preferably copolymerized, and the copolymerization of an (α-lower alkyl)acrylate ester containing an acid-dissociable, dissolution-inhibiting group, an (α-lower alkyl)acrylate ester that contains a lactone-containing monocyclic or polycyclic group, and an (α-lower alkyl)acrylate ester that contains a polar group-containing aliphatic hydrocarbon group is particularly desirable.

The step (Q) may be either conducted at the same time as the step (P), or conducted following the step (P).

Here the expression "conducted at the same time" means that the polymerization of the monomer is conducted in the presence of the acid, whereas the expression "conducted following the step (P)" means that the acid is added following halting of the polymerization reaction.

In those cases where the step (Q) and the step (P) are conducted at the same time, the step (P) may proceed in parallel with the step (Q-1) and the step (Q-2). In other words, by adding acid to the polymerization reaction containing an (α-lower alkyl)acrylate ester as the monomer, dissociation of the ester terminal portion of the (α-lower alkyl)acrylate ester, and dissociation of the ester terminal portion from the structural unit (a1) within the produced polymer proceed at the same time as the polymerization of the monomer.

In such cases, the acid may be mixed with the solvent, monomer, polymerization initiator or chain transfer agent prior to polymerization, or may be supplied to the polymerization system alone, or in combination with the solvent, monomer, polymerization initiator or chain transfer agent.

The timing with which the acid is added may be prior to heating, during dropwise addition, during aging, or within the period between completion of aging and halting of the reaction.

On the other hand, in those cases where the step (O) is conducted following the step (P), then only the step (Q-2) is conducted as the step (Q).

In those cases where the step (Q) is conducted following the step (P), heating can be conducted in the presence of the acid, either immediately following completion of the step (P), or following a purification step of removing impurities such as unreacted monomer which is conducted following the step (P).

The types of acids that can be used in the step (Q) and the concentration of the acid are as described above.

Furthermore, the reaction temperature and reaction time can be set appropriately in accordance with factors such as the desired proportion of the structural unit (a2), and the nature of the acid, the (α-lower alkyl)acrylic acid, and the ester terminal portion of the (α-lower alkyl)acrylate ester being used. The reaction temperature is typically 40° C. or higher, and is preferably conducted at the polymerization temperature described above for the step (P), whereas the reaction time is typically at least 30 minutes, and is preferably 1 hour or longer.

The copolymer obtained following completion of the step (P), or the steps (P) and (Q), includes unwanted substances such as unreacted monomer, low molecular weight components such as oligomers, residual quantities of the polymerization initiator, the chain transfer agent or reaction residues thereof, and the acid used in the step (Q), and consequently a step (R) of purifying the copolymer obtained following completion of the step (P) or the steps (P) and (Q) is preferably conducted.

Examples of suitable purification methods include the methods (R-1), (R-1a), (R-1b), (R-2), and (R-2a) described below.

(R-1): a method in which a poor solvent is added to precipitate the copolymer, and the solvent phase is then separated.

(R-1a): a method in which following (R-1), a poor solvent is added, and following washing of the copolymer, the solvent phase is separated.

(R-1b): a method in which following (R-1), a good solvent is added to re-dissolve the copolymer, a poor solvent is then added to re-precipitate the copolymer, and the solvent phase is then separated.

(R-2): a method in which a poor solvent is added to form a two-phase system containing the poor solvent and the good solvent, and the poor solvent phase is then separated.

(R-2a): a method in which following (R-2), a poor solvent is added, and following washing of the good solvent phase, the poor solvent phase is separated.

Any of these methods may be conducted either once or repeatedly. Furthermore, two or more methods may also be used in combination.

There are no particular restrictions on the poor solvent, provided it is a solvent in which the copolymer is substantially insoluble, and suitable examples include alcohols such as methanol and isopropanol, and saturated hydrocarbons such as hexane and heptane.

There are no particular restrictions on the good solvent, provided it readily dissolves the copolymer, although from the viewpoint of production control, the same solvent as the polymerization solvent is preferably used.

Furthermore; in those cases where the step (R) is conducted following the step (Q), the acid used in the step (Q) may be removed using one of the methods (R-3) and (R-4) described below.

(R-3): a method in which the acid is neutralized with a basic substance such as an amine.

(R-4): a method in which the acid is adsorbed using a basic ion exchange resin or the like.

Either of these methods may be conducted either once or repeatedly. Furthermore, the methods may also be used in combination. Moreover, these methods may also be used in combination with the methods (R-1), (R-1a), (R-1b), (R-2) and (R-2a) described above.

In those cases where the acid used in the step (Q) is removed using either (R-1) or (R-2), the use of either water, or an alcohol such as methanol or isopropanol is preferred.

Because the purified copolymer contains some of the solvent used during the purification, the conversion of the copolymer to a resist solution can be conducted either by drying the copolymer under reduced pressure and then dissolving the copolymer in the type of organic solvent (resist solvent) described below, or by conducting a solvent substitution by dissolving the copolymer in a good solvent such as the resist solvent or the polymerization solvent, and then removing the low boiling point substances other than the resist solvent under reduced pressure, while additional resist solvent is added as required.

There are no particular restrictions on the temperature used during the drying under reduced pressure or the solvent substitution, provided the copolymer undergoes no degradation, although the temperature is typically no higher than 100° C., preferably no higher than 80° C., and is most preferably 70° C. or lower.

Furthermore, if the quantity of the resist solvent used in the solvent substitution is too small, then the low boiling point substances may not be adequately removed, whereas if the quantity is too large, then the solvent substitution takes considerable time, meaning an unnecessarily high degree of heat history is imparted to the copolymer. The quantity of the resist solvent is typically within a range from 1.05 to 10 times, preferably within a range from 1.1 to 5 times, and is even more preferably from 1.2 to 3 times, the solvent quantity within the final product solution.

<Component (B)>

As the component (B), any of the known acid generators used within conventional chemically amplified resist compositions can be used without any particular restrictions. Examples of these acid generators are numerous, and include onium salt-based acid generators such as iodonium salts and sulfonium salts, oxime sulfonate-based acid generators, diazomethane-based acid generators such as bisalkyl or bisaryl sulfonyl diazomethanes and diazomethane nitrobenzyl sulfonates, iminosulfonate-based acid generators, and disulfone-based acid generators.

Specific examples of suitable onium salt-based acid generators include diphenyl)iodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, and diphenylmonomethylsulfonium trifluoromethanesulfonate, heptafluoropropanesulfonate or nonafluorobutanesulfonate.

Specific examples of suitable oxime sulfonate-based acid generators include α-(methylsulfonyloxyimino)-phenyl acetonitrile, α-(methylsulfonyloxyimino)-p-methoxyphenyl acetonitrile, α-(trifluoromethylsulfonyloxyimino)-phenyl acetonitrile, α-(trifluoromethylsulfonyloxyimino)-p-methoxyphenyl acetonitrile, α-(ethylsulfonyloxyimino)-p-methoxyphenyl acetonitrile, α-(propylsulfonyloxyimino)-p-methylphenyl acetonitrile, and α-(methylsulfonyloxyimino)-p-bromophenyl acetonitrile. Of these, α-(methylsulfonyloxyimino)-p-methoxyphenyl acetonitrile is preferred.

Of the aforementioned diazomethane-based acid generators, specific examples of suitable bisalikyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

In the present invention, the use of an onium salt containing a fluorinated alkylsulfonate ion as the anion is preferred.

As the component (B), either a single acid generator may be used alone, or a combination of two or more different acid generators may be used.

The quantity used of the component (B) is typically within a range from 0.5 to 30 parts by weight, and even more preferably from 1 to 10 parts by weight, per 100 parts by weight of the component (A). Provided the proportion of the component (B) falls within this numerical range, satisfactory pattern formation can be achieved. Furthermore, a uniform solution is obtained, and the storage stability is also favorable, both of which are desirable.

<Component (S)>

The component (S) may be any solvent capable of dissolving the various components used to generate a uniform solution, and one or more solvents selected from known materials used as the solvents for conventional chemically amplified resists can be used.

Examples of the solvent include lactones such as γ-butyrolactone; ketones such as acetone, methyl ethyl ketone, cyclohexanone, methyl isoamyl ketone and 2-heptanone; polyhydric alcohols and derivatives thereof such as ethylene glycol, diethylene glycol, propylene glycol, and dipropylene glycol; polyhydric alcohol derivatives including compounds with an ester linkage such as ethylene glycol monoacetate, diethylene glycol monoacetate, propylene glycol monoacetate and dipropylene glycol monoacetate, and compounds with an ether linkage such as the monomethyl ether, monoethyl ether, monopropyl ether, monobutyl ether or monophenyl ether of any of the above polyhydric alcohols or the above compounds with an ester linkage; cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate.

These organic solvents may be used either alone, or as a mixed solvent containing two or more different solvents.

Of these solvents, propylene glycol monomethyl ether acetate (PGMEA), propylene glycol monomethyl ether (PGME), and EL are preferred.

Furthermore, mixed solvents produced by mixing PGMEA with a polar solvent are also preferred. Although the blend ratio (the weight ratio) in such mixed solvents can be set in accordance with factors such as the co-solubility of the PGMEA and the polar solvent, the ratio is preferably within a range from 1:9 to 9:1, and is even more preferably from 2:8 to 8:2.

More specifically, in those cases where EL is added as the polar solvent, the weight ratio PGMEA:EL is preferably within a range from 1:9 to 9:1, and is even more preferably from 2:8 to 8:2. Furthermore, in those cases where PGME is used as the polar solvent, the weight ratio PGMEA:PGME is preferably within a range from 1:9 to 9:1, even more preferably from 2:8 to 8:2, and is most preferably from 3:7 to 7:3.

Furthermore, as the component (S), mixed solvents containing at least one of PGMEA and EL, together with γ-butyrolactone, are also preferred. In such cases, the weight ratio of the former and latter components in the mixed solvent is preferably within a range from 70:30 to 95:5.

There are no particular restrictions on the quantity used of the component (S), although in those cases where a positive resist composition is produced as the final product, the quantity should be set in accordance with the coating film thickness required, at a concentration that enables favorable application of the solution to a substrate or the like. Typically the quantity of the component (S) is set so that the solid fraction concentration of the positive resist composition is within a range from 2 to 20% by weight, and preferably from 5 to 15% by weight.

<Other Components>

In the positive resist composition, in order to improve the resist pattern shape and the post exposure stability of the latent image formed by the pattern-wise exposure of the resist layer, a nitrogen-containing organic compound (D) (hereafter referred to as the component (D)) may be added as an optional component.

A multitude of these components (D) have already been proposed, and any of these known compounds can be used. However, an aliphatic amine, and particularly a secondary aliphatic amine or tertiary lower aliphatic amine is preferred.

Examples of these aliphatic amines include amines in which at least one hydrogen atom of ammonia $NH_3$ has been substituted with an alkyl group or hydroxyalkyl group of 1 to 12 carbon atoms (that is, alkylamines or alkyl alcohol amines). Specific examples of these aliphatic amines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine.

Of these, alkyl alcohol amines and trialkyl amines are preferred, and alkyl alcohol amines are the most desirable. Amongst the various alkyl alcohol amines, triethanolamine and triisopropanolamine are the most preferred.

These compounds may be used either alone, or in combinations of two or more different compounds.

These compounds may be used either alone, or in combinations of two or more different compounds.

The component (D) is typically used in a quantity within a range from 0.01 to 5.0 parts by weight per 100 parts by weight of the component (A).

Furthermore, in order to prevent any deterioration in sensitivity, and improve the resist pattern shape and the post exposure stability of the latent image formed by the pattern-wise exposure of the resist layer, an organic carboxylic acid, or a phosphorus oxo acid or derivative thereof (E) (hereafter referred to as the component (E)) may also be added to the positive resist composition as another optional component.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid.

When added, the component (E) is typically used in a quantity within a range from 0.01 to 5.0 parts by weight per 100 parts by weight of the component (A).

Other miscible additives can also be added to the positive resist composition according to need, and examples include additive resins for improving the performance of the resist film, surfactants for improving the coating properties, dissolution inhibitors, plasticizers, stabilizers, colorants, halation prevention agents, and dyes and the like.

<<Positive Resist Composition>>

The positive resist composition obtained using the production method of the present invention described above is able to form a resist pattern with reduced levels of both bridge-type defects and reprecipitation-type defects.

Furthermore, the positive resist composition of the present invention also exhibits favorable levels of lithographic properties such as sensitivity and depth of focus (DOF).

Furthermore, the foreign matter characteristics of the positive resist composition are also excellent, with the composition containing a minimal quantity of foreign matter. Furthermore, the storage stability as a resist solution is also excellent with favorable suppression of foreign matter generation during storage, and consequently excellent storage stability.

Moreover, a positive resist composition obtained in the manner described above displays minimal change in the makeup of the composition before and after the filtering treatment.

As a result, the size of resist patterns formed using the positive resist composition displays a superior level of stability.

For the above positive resist composition resist composition, the level of defects, the foreign matter characteristics, and the storage stability as a resist solution can be evaluated, for example, using the methods described below.

The level of defects within a resist pattern can be evaluated in terms of the number of so-called surface defects, which can be detected using a surface defect inspection apparatus KLA2132 (a product name) manufactured by KLA Tencor Corporation. Furthermore, a determination as to whether a defect is a reprecipitation-type defect or a bridge-type defect can be made on the basis of observation using a measuring SEM (scanning electron microscope) or the like.

The foreign matter characteristics and the storage stability as a resist solution can be evaluated by using a particle counter to measure the number of foreign matter particles. For example, the foreign matter characteristics can be evaluated by using a liquid particle counter (product name: Particle Sensor KS-41 or KL-20K, manufactured by Rion Co., Ltd.) to measure the positive resist composition immediately following completion of the filtering treatment. Furthermore, the storage stability as a resist solution is evaluated in the same manner as the foreign matter characteristics, by measuring samples that have been stored in a freezer, a refrigerator, or at room temperature (25° C.).

In a particle counter, the number of particles with a particle size within a range from 0.15 μm to 0.3 μm is counted per 1 cm³ of composition. The measurement limit is typically approximately 20,000 particles/cm³, and measurement of larger numbers of particles is impossible. Specifically, the aforementioned Particle Sensor KS-41 can be used to measure the number of particles of particle size 0.15 μm or greater.

An evaluation of whether or not the makeup of the positive resist composition changes can be performed by analyzing and comparing the respective concentration values for the materials within the positive resist composition prior to, and then following, passage through the filter, and by measuring any changes in the sensitivity (the optimum exposure dose) or the resist pattern size when forming a resist pattern using the positive resist composition.

<<Method of Forming Resist Pattern>>

A method of forming a resist pattern using the positive resist composition of the present invention can be conducted, for example, in the manner described below.

First, the positive resist composition is applied to a substrate such as a silicon wafer using a spinner or the like, and a prebake is then conducted under temperature conditions of 80 to 150° C., for a period of 40 to 120 seconds, and preferably for 60 to 90 seconds, thereby forming a resist film.

Next, the resist film is selectively exposed, for example with an ArF exposure apparatus or the like, by irradiating ArF excimer laser light through a desired mask pattern, and PEB (post exposure baking) is then conducted under temperature conditions of 80 to 150° C., for a period of 40 to 120 seconds, and preferably for 60 to 90 seconds.

Subsequently, developing is conducted using an alkali developing solution such as a 0.1 to 10% by weight aqueous solution of tetramethylammonium hydroxide. If required, a post-bake may be conducted following the developing treatment.

In this manner, a resist pattern that is faithful to the mask pattern can be obtained.

An organic or inorganic anti-reflective film may also be provided between the substrate and the applied layer of the positive resist composition.

There are no particular restrictions on the wavelength used for the exposure (the irradiation), and an ArF excimer laser, KrF excimer laser, $F_2$ excimer laser, or other radiation such as EUV (extreme ultra violet), VUV (vacuum ultra violet), EB (electron beam), X-ray or soft X-ray radiation can be used. The present invention is particularly effective with an ArF excimer laser.

As described above, in the present invention, by conducting the step (I) using a positive resist composition containing the component (A), a positive resist composition is obtained that is capable of forming a resist pattern with reduced levels of both bridge-type defects and reprecipitation-type defects. Furthermore, the obtained positive resist composition also has favorable lithographic properties.

It is thought that the reason for these effects is that including the step (I) enables a reduction in the level of bridge-type defects, whereas using a specified copolymer as the component (A) enables a reduction in the level of defects, and particularly the level of reprecipitation-type defects.

The reason why the inclusion of the step (I) enables a reduction in the level of bridge-type defects is not entirely clear, but it is thought that in the step (I), those substances within the positive resist composition that can cause bridge-type defects, such as resins containing large quantities of structural units with comparatively high polarity such as the structural units (a12) and (a13) are adsorbed selectively onto the surface of the nylon membrane, meaning the quantity of these defect-causing substances within the positive resist composition can be reduced.

The reason why the use of the specified copolymer as the component (A) enables a reduction in the level of defects, and particularly the level of reprecipitation-type defects, is thought to be due to the fact that the copolymer has a reduced level of variation in the distribution of (α-lower alkyl)acrylic acid structural units within the molecule.

In other words, one potential method of reducing the level of defects, and particularly the level of reprecipitation-type defects, involves enhancing the affinity between the resist and the developing solution by increasing the hydrophilicity of the base resin by introducing polar groups such as hydroxyl groups or carboxyl groups into the resin. However, increasing the hydrophilicity of the base resin is usually accompanied by a deterioration in the lithographic properties, meaning achieving both a reduction in the level of defects and superior lithographic properties is extremely difficult. This effect is thought to be due to the differences in the polarities and polymerization rates of the plurality of monomers used in the synthesis of the component (A). For example, comparison of an (α-lower alkyl)acrylate ester with an (α-lower alkyl)

acrylic acid reveals that the (α-lower alkyl)acrylic acid has a higher polymerization rate. It is thought that, as a result, the distribution of the various structural units within the resins used in conventional resists tends to be uneven, meaning portions of high hydrophobicity and portions of low hydrophobicity are generated within the molecule, leading to a deterioration in the lithographic properties.

In contrast, in the present invention, an (α-lower alkyl) acrylate ester is polymerized alone for example, and the ester terminal portion of the ester is then dissociated by acid, which enables the formation of a structure with a reduced level of variation in the distribution of the (α-lower alkyl)acrylic acid structural units within the molecule, meaning that not only is the level of defects reduced, but superior lithographic properties are also obtained.

According to investigations conducted by the inventors of the present invention, comparison of a resist that uses a copolymer obtained by conducting a polymerization of an (α-lower alkyl)acrylate ester in the presence of an acid, and a resist that uses a copolymer obtained by conducting a polymerization of an (α-lower alkyl)acrylate ester and an (α-lower alkyl)acrylic acid in the absence of acid reveals that whereas the latter exhibits poor lithographic properties such as DOF, the former resist exhibits both favorable lithographic properties and a reduced level of defects, indicating that there are differences in the detailed structures of the former and the latter.

EXAMPLES

As follows is a description of examples of the present invention, although the scope of the present invention is in no way limited by these examples.

Meanings of the abbreviations used in the following examples are listed below.

G: a structural unit derived from γ-butyrolactone methacrylate
Monomer G: γ-butyrolactone methacrylate
Ga: a structural unit derived from γ-butyrolactone acrylate
Monomer Ga: γ-butyrolactone acrylate
M: a structural unit derived from 2-methyl-2-adamantyl methacrylate
Monomer M: 2-methyl-2-adamantyl methacrylate
Ma: a structural unit derived from 2-methyl-2-adamantyl acrylate
Monomer Ma: 2-methyl-2-adamantyl acrylate
O: a structural unit derived from 3-hydroxy-1-adamantyl methacrylate
Monomer O: 3-hydroxy-1-adamantyl methacrylate
Oa: a structural unit derived from 3-hydroxy-1-adamantyl acrylate
Monomer Oa: 3-hydroxy-1-adamantyl acrylate
MA: a structural unit derived from methacrylic acid
AA: a structural unit derived from acrylic acid In the synthesis examples described below, the values of Mw and Mw/Mn for the copolymer, and the respective proportions (the molar ratio) of the structural units that constitute the copolymer were determined using the methods described below.

(1) Measurement (by GPC) of Mw and Mw/Mn for the Copolymer

Measured by GPC. The analysis conditions used are listed below.

Apparatus: GPC8220 (a product name), manufactured by Tosoh Corporation
Detector: differential refractive index (RI) detector
Columns: KF-804L (a product name), manufactured by Showa Denko K.K.×3 columns
Sample: a measurement sample was prepared by dissolving approximately 0.1 g of the copolymer powder in approximately 1 ml of tetrahydrofuran. The quantity injected into the GPC was 15 μl.

(2) Measurement of the Composition of Structural Units Derived from (α-lower alkyl) Acrylate Esters within the Copolymer ($^{13}$C-NMR)

Using $^{13}$C-NMR, the proportion of each structural unit (mol %) relative to the combined total of all the structural units derived from (α-lower alkyl)acrylate esters (the combined total of G or Ga, M or Ma, and O or Oa) within the copolymer was determined under the analysis conditions listed below.

Apparatus: AV400 (a product name), manufactured by the Bruker Group
Sample: a sample was prepared by dissolving approximately 1 g of the copolymer powder and 0.1 g of Cr(acac)$_2$ in 1 g of methyl ethyl ketone (MEK) and 1 g of deuterated acetone ("acac"=acetylacetonate)
Measurement: a measurement tube with a diameter of 10 mm was used, and measurement was conducted at a temperature of 40° C. using a number of scans of 10,000.

(3) Calculation of Structural Unit Proportions within the Copolymer

The copolymers obtained in the synthesis examples 1 to 2 and the comparative example 1 (hereafter referred to as the copolymers (Q) for the sake of convenience), and copolymers produced in an identical manner to these examples but without the addition of sulfuric acid (hereafter referred to as the copolymers (P) for the sake of convenience) were each subjected to a $^{13}$C-NMR measurement under the conditions described above, and the surface area of each of the peaks was determined in the manner described below.

First, in the case of the copolymers (P), the peak surface area ratio pI for the carbonyl carbon derived from the polymerization initiator was determined using the formula (1) shown below, wherein PN represents the peak surface area for all carbonyl carbons, PA represents the peak surface area for the quaternary carbon of M or Ma, PC represents the peak surface area for the carbon bonded to the non-carbonyl oxygen atom within the lactone linkage of G or Ga, and PD represents the peak surface area for the carbon bonded to the non-carbonyl oxygen atom within the ester linkage of O or Oa.

$$pI=(PN-PA-PC-PD)/\{PA+(PC/2)+PD\} \quad \text{Formula (1)}$$

Subsequently, for each of the copolymers (Q), the ratios of M or Ma, AA or MA, G or Ga, and C or Oa, relative to the sum of M or Ma, G or Ga, and O or Oa within the copolymer (Q) were calculated as qA, qB, qC and qD respectively using the formulas (2) to (5) shown below, wherein QN represents the peak surface area for all carbonyl carbons, QA represents the peak surface area for the quaternary carbon of M or Ma, QC represents the peak surface area for the carbon bonded to the non-carbonyl oxygen atom within the lactone linkage of G or Ga, and QD represents the peak surface area for the carbon bonded to the non-carbonyl oxygen atom within the ester linkage of C or Oa.

$$qA=QA/\{QA+(QB/2)+QD\} \quad \text{Formula (2)}$$

$$qB=(QN-QA-QC-QD)/\{QA+(QC/2)+QD\}-pI \quad \text{Formula (3)}$$

$$qC=(QC/2)/\{QA+(QC/2)+QD\} \quad \text{Formula (4)}$$

$$qD=QD/\{QA+(QC/2)+QD\} \quad \text{Formula (5)}$$

Moreover, the compositional ratios of M or Ma, AA or MA, G or Ga and O or Oa within each copolymer (Q) were determined as q*A, q*B, q*C and q*D respectively using the formulas (6) to (9) shown below.

$$q^*A = qA/\{qA+qB+qC+qD\} \quad \text{Formula (6)}$$

$$q^*B = qB/\{qA+qB+qC+qD\} \quad \text{Formula (7)}$$

$$q^*C = qC/\{qA+qB+qC+qD\} \quad \text{Formula (8)}$$

$$q^*D = qD/\{qA+qB+qC+qD\} \quad \text{Formula (9)}$$

Synthesis Example 1

A container held under an atmosphere of nitrogen was charged with 1,080 g of methyl ethyl ketone (MEK) and 50 g of an MEK solution containing 34 mg of dissolved sulfuric acid, and (A) 352 g of the monomer Ma, (C) 265 g of the monomer G and (D) 186 g of the monomer Oa were then dissolved to prepare a uniform "monomer solution". Furthermore, in a separate container held under an atmosphere of nitrogen, 26 g of dimethyl 2,2'-azobisisobutyrate (MAIB) was dissolved in 52 g of MEK to prepare a uniform "initiator solution". A reaction tank fitted with a stirrer and a cooler was charged with 680 g of MEK, and following replacement of the atmosphere inside the tank with an atmosphere of nitrogen, the temperature was raised to 79° C. With the temperature inside the reaction tank maintained at 79 to 81° C., the monomer solution and the initiator solution, which were held at room temperature (approximately 25° C.), were added separately in a dropwise manner to the reaction tank at fixed rates over a four hour period, using separate constant rate pumps. Following completion of these dropwise additions, the reaction system was aged for two hours at 80 to 81° C., and the system was then cooled to room temperature and the polymerization solution was extracted.

A 20 liter container was charged with 8,100 g of n-hexane, the temperature was lowered to 15° C. with constant stirring, and this cooled state was then maintained. 2,700 g of the polymerization solution was then added dropwise to the container to precipitate the copolymer, and following stirring for a further 30 minutes, a wet cake was isolated by filtration. This wet cake was returned to the container, 5,400 g of a mixed solvent of n-hexane and MEK was added, and the wet cake was then washed by stirring for 30 minutes, and once again isolated by filtration. This washing of the wet cake was then repeated once. Subsequently, a small sample was taken from the wet cake and dried for one hour under reduced pressure at a temperature of 60° C. or less, thus yielding a dry powder (a copolymer (A)-2).

For the thus obtained copolymer (A)-2, the values of Mw and Mw/Mn were determined by GPC, and the relative proportions of the repeating units were determined by $^{13}$C-NMR. The acid used in the production of the copolymer, and the results of measuring the acid concentration ppm by weight) within the reaction system, the values for Mw and Mw/Mn, and the relative proportions of the structural units within the product copolymer are all shown in Table 1.

Synthesis Example 2

With the exceptions of altering the monomers added to the monomer solution to 384 g of the monomer M, 250 g of the monomer Ga, 179 g of the monomer 0 and 31 mg of sulfuric acid, and altering the quantity of the initiator solution to 64 g and the quantity of MAIB to 32 g, a copolymer (A)-4 was prepared in the same manner as the synthesis example 1. The acid used in the production of the copolymer, and the results of measuring the acid concentration (ppm by weight) within the reaction system, the values for Mw and Mw/Mn, and the relative proportions of the structural units within the product copolymer (A-4) are all shown in Table 1.

Comparative Synthesis Example 1

With the exception of adding absolutely no sulfuric acid, a copolymer (A)-5 was prepared in the same manner as the synthesis example 1. The results of measuring the values for Mw and Mw/Mn, and the relative proportions of the structural units within the product copolymer are all shown in Table 1.

TABLE 1

| | Acid | | GPC | | Structural unit composition (mol %) | | | | | | | |
|---|---|---|---|---|---|---|---|---|---|---|---|---|
| | | Concentration | | | | | | | | | | |
| Name | | ppm | Mw | Mw/Mn | G | Ga | M | Ma | O | Oa | MA | AA |
| (A)-2 | Sulfuric acid | 12 | 9,980 | 2.17 | 40.5 | — | — | 34.2 | — | 21.2 | — | 4.1 |
| (A)-4 | Sulfuric acid | 11 | 10,280 | 2.02 | — | 40.3 | 35.1 | — | 20.1 | — | 4.5 | — |
| (A)-5 | — | — | 9,990 | 2.14 | 40.0 | — | — | 38.9 | — | 21.1 | — | — |

Examples 1 to 3

Comparative Examples 1 to 4

Using the blend quantities shown in Table 2, the component (A), component (B), component (D), component (E) and component (S) were mixed together and dissolved, yielding a series of crude positive resist compositions.

Subsequently each of the crude positive resist compositions prepared above was passed through the filter shown in Table 2. In other words, in the examples 1 to 2 and the comparative example 4, a nylon filter described below was used as the first filter 2a within the first filtering unit 2 of the filtering apparatus shown in FIG. 1, a polypropylene filter described below was used as the second filter 4a within the second filtering unit 4, and 4,000 ml of each of the crude positive resist compositions prepared above was supplied from the storage tank 1 to the first filtering unit 2 and sequentially filtered through the first filter 2a and the second filter 4a, thus yielding a positive resist composition. The filtration pressure for the crude positive resist composition supplied to the first filtering unit 2 and the second filtering unit 4 was set to 0.4 kgf/cm$^2$.

Nylon filter (flat membrane type): product name "Ultipleat" (a registered trademark) "P-Nylon" (manufactured by Pall Corporation, with a pore size of 0.04 μm, a zeta potential of −15 mV, and specifications including a filtration pressure [differential pressure resistance (38°

C.)] of 4.2 kgf/cm² and a surface area (filtration area) of 0.09 m². The filter was a disposable type filter with dimensions of diameter: 72 mm×height: 114.5 mm. The critical surface tension was 77 dyne/cm.)

Polypropylene filter (hollow membrane type): product name "Polyfix FOF50 series" (manufactured by KITZ Corporation, with a pore size of 0.02 μm, and specifications including a filtration pressure [differential pressure resistance (20° C.)] of 0.4 MPa and a surface area (filtration surface area) of 3,800 cm². The filter was a disposable type filter with dimensions of diameter: 50 mm×height: 150 mm.)

In the example 3, with the exception of not using the polypropylene filter within the second filtering unit 4, a positive resist composition was obtained in the same manner as the examples 1 and 2.

In the comparative examples 1 and 2, as the second filtering unit 4 within the second filtering unit 4 of the filtering apparatus shown in FIG. 1, either the polypropylene filter used in the examples 1 to 2 and the comparative example 4 was used (the comparative example 1) or the polytetrafluoroethylene (PTFE) filter described below was used (the comparative example 2), and 4,000 ml of each of the crude positive resist compositions prepared above was supplied directly from the storage tank 1 to the second filtering unit 4 and filtered through the second filter 4a provided inside the second filtering unit 4, thus yielding a positive resist composition.

The filtration pressure for the crude positive resist composition supplied to the second filtering unit 4 was set to 0.4 kgf/cm².

PTFE filter: product name "Emflon" (manufactured by Pall Corporation, with a zeta potential of −20 mV, a pore size: 0.05 μm, and specifications including a filtration pressure [differential pressure resistance (38° C.)] of 3.5 kgf/cm² and a surface area (filtration area) of 0.13 m². The critical surface tension was 28 dyne/cm. Furthermore, the filter was a disposable type filter with dimensions of diameter: 72 mm×height: 114.5 mm.)

In the comparative example 3, with the exception of using the PTFE filter used in the comparative example 2 instead of the nylon filter used in the examples 1 to 2 and the comparative example 4, a positive resist composition was obtained in the same manner as the examples 1 to 2 and the comparative example 4.

The abbreviations used for each of the components shown in Table 2 have the meanings shown below. Furthermore, the numerical values within the brackets [ ] shown below the abbreviations represent the blend quantities (parts by weight).

(B)-1: 4-methylphenyldiphenylsulfonium nonafluorobutanesulfonate
(D)-1 triethanolamine
(E)-1: salicylic acid
(S)-1: a mixed solvent in which PGMEA:EL=6:4 (weight ratio)

In Table 2, PE represents polyethylene, PP represents polypropylene, and PTFE represents polytetrafluoroethylene.

Subsequently, the obtained positive resist compositions were subjected to the evaluations described below.

—Evaluation of Defects (Reprecipitation-Type and Bridge-Type)

[Initial Evaluation]

Using a spinner, each positive resist composition solution obtained above was applied directly to the surface of an 8-inch silicon wafer that had been treated with hexamethyldisilazane (HMDS), and the solution was then prebaked (PAB) and dried on a hotplate at 105° C. for 90 seconds, thus forming a resist film with a film thickness of 220 nm.

Subsequently, the resist film was selectively irradiated with an ArF excimer laser (193 nm) through a (binary) mask pattern, using an ArF exposure apparatus NSR-S306 (manufactured by Nikon Corporation, NA (numerical aperture)=0.60, σ=0.30).

The irradiated resist was then subjected to PEB treatment at 110° C. for 90 seconds, subsequently subjected to puddle development for 60 seconds at 23° C. in a 2.38% by weight aqueous solution of tetramethylammonium-hydroxide, and a rinse liquid was then dripped onto the resist for one second at 1,000 rpm and then for 15 seconds at 500 rpm (enforced conditions for increasing the likelihood of defect occurrence), before the resist was dried to form a resist pattern.

Furthermore, the pattern was formed as a dense hole pattern with a hole diameter of 300 nm (a pattern in which holes of diameter 300 nm were spaced at 300 nm intervals).

Subsequently, a surface defect inspection device KLA2351 (a product name) manufactured by KLA Tencor Corporation was used to measure the number of defects within the wafer. Furthermore, these defects were then inspected using a mea-

TABLE 2

| | Filter [pore size (μm)] | | Resist Composition [Blend quantity (parts by weight)] | | | | |
| --- | --- | --- | --- | --- | --- | --- | --- |
| | First filtering unit 2 | Second filtering unit 4 | Component (A) | Component (B) | Component (D) | Component (E) | Component (S) |
| Example 1 | Nylon [0.04] | PP [0.02] | (A)-2 [100] | (B)-1 [3.5] | (D)-1 [0.1] | — | (S)-1 [750] |
| Example 2 | Nylon [0.04] | PP [0.02] | (A)-4 [100] | (B)-1 [3.5] | (D)-1 [0.1] | (E)-1 [0.1] | (S)-1 [750] |
| Example 3 | Nylon [0.04] | — | (A)-4 [100] | (B)-1 [3.5] | (D)-1 [0.1] | (E)-1 [0.1] | (S)-1 [750] |
| Comparative example 1 | — | PP [0.02] | (A)-4 [100] | (B)-1 [3.5] | (D)-1 [0.1] | (E)-1 [0.1] | (S)-1 [750] |
| Comparative example 2 | — | PTFE [0.05] | (A)-4 [100] | (B)-1 [3.5] | (D)-1 [0.1] | (E)-1 [0.1] | (S)-1 [750] |
| Comparative example 3 | PTFE [0.05] | PP [0.02] | (A)-4 [100] | (B)-1 [3.5] | (D)-1 [0.1] | (E)-1 [0.1] | (S)-1 [750] |
| Comparative example 4 | Nylon [0.04] | PP [0.02] | (A)-5 [100] | (B)-1 [3.5] | (D)-1 [0.1] | — | (S)-1 [750] | suring SEM S-9220 (manufactured by Hitachi, Ltd.) to confirm whether the defects were reprecipitation-type defects or bridge-type defects. As a result, so-called wine stain defects, which describe color irregularities on the resist pattern surface, were detected as reprecipitation-type defects, and so-called "Not Open" defects, in which a hole portion of the hole pattern has been bridged with resist and is not open, were detected as bridge-type defects.

The same evaluations were repeated, and the average number of defects across the two wafers was determined. The results are shown in Table 3.

[Evaluation Following 3 Months Refrigeration]

With the exception of using a positive resist composition that had been refrigerated (5° C.) for 3 months, the number of bridge-type defects was evaluated in the same manner as that described above for the [initial evaluation]. The results are shown in Table 3.

[Evaluation Following 3 Months at Room Temperature]

With the exception of using a positive resist composition that had been stored at room temperature (25° C.) for 3 months, the number of bridge-type defects was evaluated in the same manner as that described above for the [initial evaluation]. The results are shown in Table 3.

[Evaluation Following 3 Months at 40° C.]

With the exception of using a positive resist composition that had been stored at 40° C. for 3 months, the number of bridge-type defects was evaluated in the same manner as that described above for the [initial evaluation]. The results are shown in Table 3.

—Evaluation of Lithographic Properties

[Evaluation of Sensitivity (Eop)]

An organic anti-reflective film composition "ARC-29A" (a product name, manufactured by Brewer Science Ltd.) was applied to the surface of an 8-inch silicon wafer using a spinner, and the composition was then baked and dried on a hotplate at 205° C. for 60 seconds, thereby forming an organic anti-reflective film with a film thickness of 77 nm. The positive resist composition solution was then applied to the surface of this anti-reflective film using a spinner, and was then prebaked (PAB) and dried on a hotplate at 105° C. for 90 seconds, thereby forming a resist film with a film thickness of 220 μm.

Subsequently, this film was selectively irradiated with an ArF excimer laser (193 nm) through a (6% half-tone) mask pattern, using an ArF exposure apparatus NSR-S306 (manufactured by Nikon Corporation; NA (numerical aperture)=0.78, ½ annular illumination).

The resist was then subjected to a PEB treatment at 110° C. for 90 seconds, was subsequently subjected to puddle development for 60 seconds at 23° C. in a 2.38% by weight aqueous solution of tetramethylammonium hydroxide, and was then washed for 20 seconds with water and dried. The PAB and PEB temperatures are shown in Table 3.

The optimum exposure Fop (mJ/cm$^2$) for forming a contact hole pattern with a hole diameter of 100 nm and a pitch of 220 nm was determined. The results are shown in Table 3.

[Evaluation of Depth of Focus (DOF)]

Using the above Eop value, the focal point was appropriately offset up or down, and the depth of focus (DOF) range (μm) across which a contact hole pattern with a hole diameter of 100 nm and a pitch of 220 nm could be formed with a dimensional variation for the diameter of 100 nm±10% was determined. The results are shown in Table 3.

TABLE 3

| | Defects (number) | | | | | Lithographic properties | |
|---|---|---|---|---|---|---|---|
| | Reprecipitation- | | Bridge-type defects | | | | |
| | type (wine stain) Initial | Initial | 3 months refrigeration | 3 months at room temperature | 3 months at 40° C. | Eop (mJ/cm$^2$) | DOF (μm) |
| Example 1 | 442 | 5 | 7 | 9 | 46 | 25.0 | 4.0 |
| Example 2 | 150 | 4 | 6 | 8 | 41 | 27.0 | 4.0 |
| Example 3 | 150 | 10 | 40 | 163 | 300 | 27.0 | 4.0 |
| Comparative example 1 | 150 | 36 | Exceeds detection limit * | Exceeds detection limit * | Exceeds detection limit * | 27.0 | 4.0 |
| Comparative example 2 | 150 | 340 | Exceeds detection limit * | Exceeds detection limit * | Exceeds detection limit * | 27.0 | 4.0 |
| Comparative example 3 | 150 | 17 | 82 | 270 | Exceeds detection limit * | 27.0 | 4.0 |
| Comparative example 4 | 67,000 | 6 | 9 | 11 | 51 | — | — |

* Detection limit = 125,000 or higher

As described above, in the examples 1 to 3, in which a copolymer produced in the presence of sulfuric acid was used as the component (A), and filtration was conducted using a filter equipped with a nylon membrane, the levels of both reprecipitation-type defects and bridge-type defects were able to be reduced. Furthermore, the lithographic properties such as Eop and DOF were also favorable.

In contrast, in the comparative examples 1 to 3, which did not use a filter equipped with a nylon membrane, the number of bridge-type defects was considerably higher even though a positive resist composition with the same composition as that of the example 2 was used.

Furthermore, in the comparative example 4, which used a filter equipped with a nylon membrane, but used a copolymer (A)-5 that was produced without the addition of acid, the quantity of bridge-type defects was low, but the number of reprecipitation defects was high right from the initial stages. As a result, the lithographic properties were not even evaluated.

INDUSTRIAL APPLICABILITY

A method of producing a positive resist composition, a positive resist composition, and a method of forming a resist pattern according to the present invention are capable of forming resist patterns with reduced levels of both bridge-type defects and reprecipitation-type defects, and are consequently very useful industrially.

The invention claimed is:

1. A method of producing a positive resist composition, comprising a step (I) of passing a positive resist composition, which is obtained by dissolving a resin component (A) that displays increased alkali solubility under action of acid and an acid generator component (B) that generates acid upon exposure in an organic solvent (S), through a filter (f1) equipped with a nylon membrane, wherein
said resin component (A) is a copolymer containing at least two structural units obtained by polymerizing at least one monomer in the presence of acid,
at least one of said monomers is an (α-lower alkyl) acrylate ester, and
said resin component (A) comprises a structural unit (a1) derived from the (α-lower alkyl) acrylate ester within a main chain.

2. A method of producing a positive resist composition according to claim 1, further comprising a step (II), which is conducted before and/or after said step (I), of passing said positive resist composition through a filter (f2) equipped with a polyethylene or polypropylene membrane.

3. A method of producing a positive resist composition according to claim 1, wherein said resin component (A) is a copolymer obtained by conducting a polymerization of said monomer in solution, and said solution contains a concentration of acid within a range from 0.1 to 1,000 ppm.

4. A method of producing a positive resist composition according to claim 1, wherein said resin component (A) is a copolymer comprising a structural unit (a11) derived from an (α-lower alkyl) acrylate ester containing an acid-dissociable, dissolution-inhibiting group, and a structural unit (a2) derived from an (α-lower alkyl) acrylic acid, and
said structural unit (a2) is at least one structural unit selected from the group consisting of structural units (a2"-1) derived from an (α-lower alkyl) acrylic acid produced by dissociation of an ester terminal portion of an (α-lower alkyl) acrylate ester under action of said acid, and structural units (a2"-2) produced by dissociation of an ester terminal portion of a structural unit derived from an (α-lower alkyl) acrylate ester under action of said acid.

5. A method of producing a positive resist composition according to claim 4, wherein said structural unit (a2) is at least one structural unit selected from the group consisting of structural units (a2"-1-1) derived from an (α-lower alkyl) acrylic acid produced by dissociation, under action of said acid, of said acid-dissociable, dissolution-inhibiting group of an (α-lower alkyl) acrylate ester that gives rise to said structural unit (a11), and structural units (a2"-2-1) produced by dissociation of said acid-dissociable, dissolution-inhibiting group of said structural unit (a11) under action of said acid.

6. A method of producing a positive resist composition according to claim 4, wherein said structural unit (a11) is a structural unit derived from an (α-lower alkyl) acrylate ester containing an acid-dissociable, dissolution-inhibiting group that comprises an aliphatic cyclic group.

7. A method of producing a positive resist composition according to claim 6, wherein said structural unit (a11) is at least one structural unit selected from the group consisting of structural units represented by general formulas (a1-1-01) and (a1-1-03) shown below:

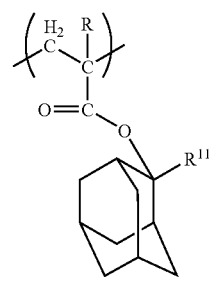

(a1-1-01)

(wherein, R represents a hydrogen atom or a lower alkyl group, and $R^{11}$ represents a lower alkyl group)

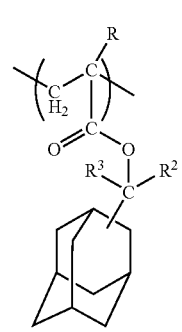

(a1-1-03)

(wherein, R represents a hydrogen atom or a lower alkyl group, and $R^2$ and $R^3$ each represent, independently, a lower alkyl group).

8. A method of producing a positive resist composition according to claim 4, wherein said resin component (A) is a copolymer that further comprises a structural unit (a12) derived from an (α-lower alkyl) acrylate ester that contains a lactone-containing monocyclic or polycyclic group.

9. A method of producing a positive resist composition according to claim 8, wherein said structural unit (a12) is at least one structural unit selected from the group consisting of structural units represented by a general formula (a2-1) shown below:

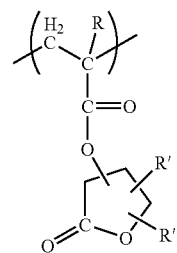

(a2-1)

(wherein, R represents a hydrogen atom or a lower alkyl group, and R' represents a hydrogen atom, a lower alkyl group, or an alkoxy group of 1 to 5 carbon atoms).

10. A method of producing a positive resist composition according to claim 4, wherein said resin component (A) is a copolymer that further comprises a structural unit (a13) derived from an (α-lower alkyl) acrylate ester that contains a polar group-containing aliphatic hydrocarbon group.

11. A method of producing a positive resist composition according to claim 10, wherein said structural unit (a13) is at least one structural unit selected from the group consisting of structural units represented by a general formula (a3-1) shown below:

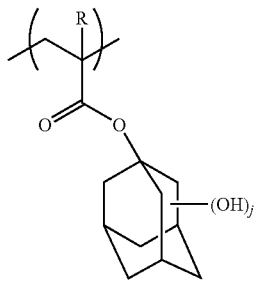

(a3-1)

(wherein, R represents a hydrogen atom or a lower alkyl group, and j represents an integer from 1 to 3).

12. A method of producing a positive resist composition according to claim 1, wherein said positive resist composition further comprises a nitrogen-containing organic compound (D).

13. A positive resist composition obtained using a method of producing a positive resist composition according to any one of claim 1 through claim 3 and claim 4 through claim 12.

14. A method of forming a resist pattern comprising:
   forming a resist film on a substrate using a positive resist composition according to claim 13;
   exposing said resist film; and
   developing said resist film to form a resist pattern.

* * * * *

UNITED STATES PATENT AND TRADEMARK OFFICE
CERTIFICATE OF CORRECTION

| | |
|---|---|
| PATENT NO. | : 7,879,527 B2 |
| APPLICATION NO. | : 11/996052 |
| DATED | : February 1, 2011 |
| INVENTOR(S) | : Masaaki Muroi et al. |

It is certified that error appears in the above-identified patent and that said Letters Patent is hereby corrected as shown below:

Col. 5, line 27, change "Ultipore" to --Ultipor--.

Col. 6, line 56, change "That" to --that--.

Col. 12, line 67, and col. 13, lines 61 and 63, change "α-lower" to --(α-lower--.

Col. 13, line 61, change "α-lower" to --(α-lower--.

Col. 13, line 63, change "α-lower" to --(α-lower--.

Col. 15, line 30, change "X" to --$X^1$--.

Col. 18, line 2, change "ad" to --and--.

Col. 18, line 53, change "Include" to --include--.

Col. 48, line 59, change "a1-1-35)" to --(a1-1-35)--.

Col. 61, line 2, change "of 1" to --of l--.

Col. 65, line 47, change "polymer" to --polymer.--.

Col. 66, line 42, change "(O)" to --(Q)--.

Col. 67, line 37, change "Furthermore;" to --Furthermore,--.

Col. 68, line 27, change "diphenyl)iodonium" to --diphenyliodonium--.

Col. 68, line 54, change "bisalikyl" to --bisalkyl--.

Col. 71, line 9 (approx.), change "excellent" to --excellent,--.

Col. 74, line 50, change "C" to --O--.

Col. 74, line 60 (approx.), change "C" to --O--.

Col. 76, line 1, change "ppm" to --(ppm--.

Col. 76, line 48, change "Subsequently" to --Subsequently,--.

Col. 78, line 34, change "tetramethylammonium-hydroxide," to --tetramethylammonium hydroxide,--.

Col. 79, line 67, change "μm." to --nm.--.

Col. 80, line 12, change "Fop" to --Eop--.

Signed and Sealed this
Ninth Day of August, 2011

David J. Kappos
*Director of the United States Patent and Trademark Office*